US012616007B2

(12) United States Patent
Manthena et al.

(10) Patent No.: US 12,616,007 B2
(45) Date of Patent: Apr. 28, 2026

(54) ISOLATION REGIONS WITHIN A MEMORY DIE

(71) Applicant: Micron Technology, Inc., Boise, ID (US)

(72) Inventors: Raja Kumar Varma Manthena, Boise, ID (US); Yoshiaki Fukuzumi, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 729 days.

(21) Appl. No.: 17/815,915

(22) Filed: Jul. 28, 2022

(65) Prior Publication Data

US 2024/0038577 A1     Feb. 1, 2024

(51) Int. Cl.
*H01L 21/762*     (2006.01)
*H01L 21/311*     (2006.01)
*H10B 41/27*     (2023.01)
*H10B 43/27*     (2023.01)

(52) U.S. Cl.
CPC .. *H01L 21/76224* (2013.01); *H01L 21/31144* (2013.01); *H10B 41/27* (2023.02); *H10B 43/27* (2023.02)

(58) Field of Classification Search
CPC ......... H01L 21/76224; H01L 21/31144; H10B 41/27; H10B 43/27
See application file for complete search history.

(56) References Cited

U.S. PATENT DOCUMENTS

2012/0211821 A1* 8/2012 Matsumoto ............ H10B 43/27
                                           257/E27.06
2020/0006373 A1* 1/2020 Kubo ..................... H10B 43/27

OTHER PUBLICATIONS

IP.COM search history (Year: 2025).*

* cited by examiner

*Primary Examiner* — Zandra V Smith
*Assistant Examiner* — Andre C Stevenson
(74) *Attorney, Agent, or Firm* — Holland & Hart LLP

(57) ABSTRACT

Methods, systems, and devices for isolation regions within a memory die are described. During fabrication, memory pillars may be formed through a stack of material in a plurality regions of a memory die. In some cases, a first plurality of trenches extending in a first direction and a second plurality of trenches extending in a second direction may be formed through the stack of material (e.g., interposed between the plurality of regions). Additionally or alternatively, first voids may be formed via the first plurality of trenches, and a dielectric material may be deposited in the first voids and the first plurality of trenches, forming first isolation regions. Then, second voids may be formed via the second plurality of trenches, and a dielectric material may be deposited in the second voids and the second plurality of trenches, forming second isolation regions.

7 Claims, 10 Drawing Sheets

SECTION A-A 300-b

SECTION A-A 300-c

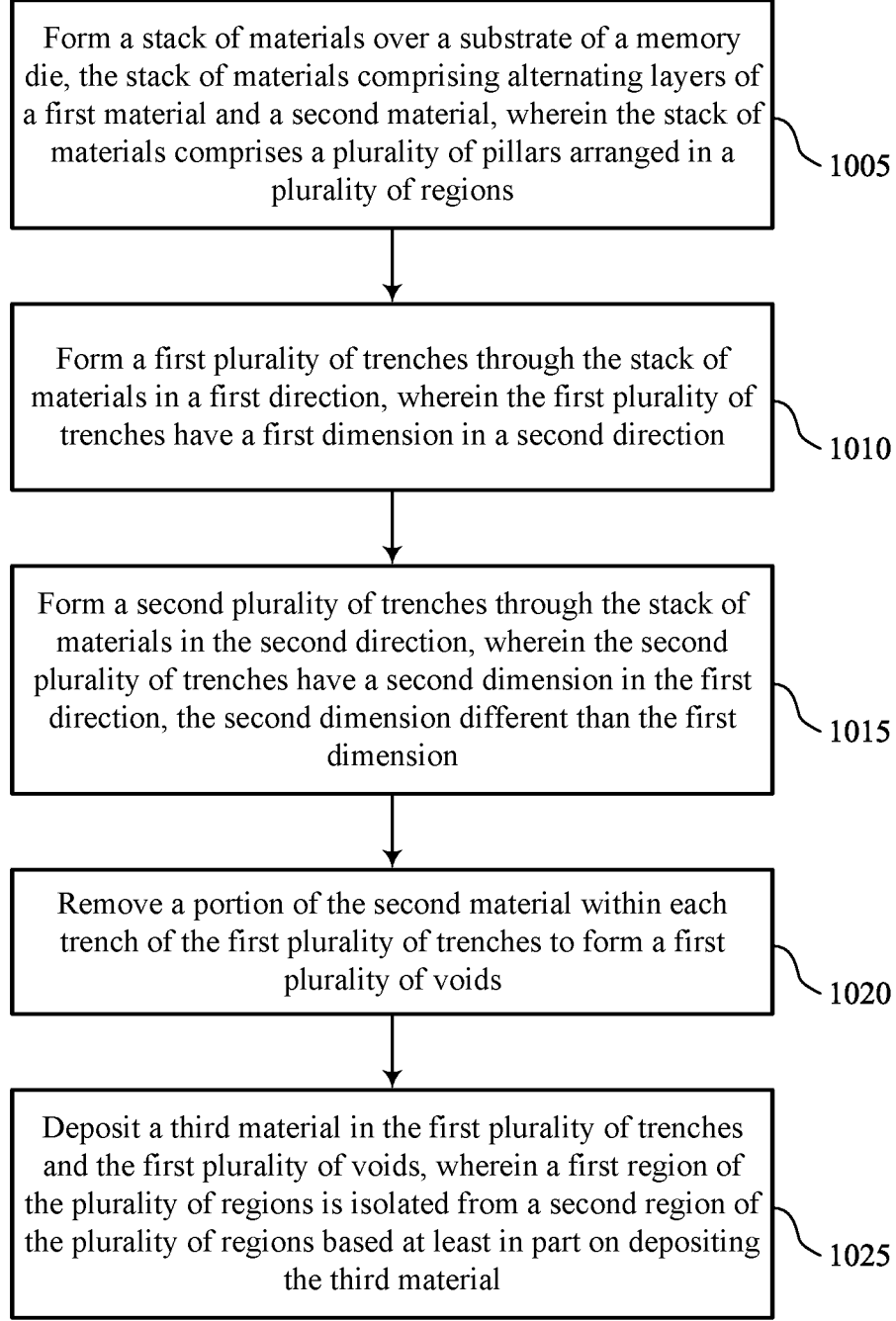

Form a stack of materials over a substrate of a memory die, the stack of materials comprising alternating layers of a first material and a second material, wherein the stack of materials comprises a plurality of pillars arranged in a plurality of regions

1005

Form a first plurality of trenches through the stack of materials in a first direction, wherein the first plurality of trenches have a first dimension in a second direction

1010

Form a second plurality of trenches through the stack of materials in the second direction, wherein the second plurality of trenches have a second dimension in the first direction, the second dimension different than the first dimension

1015

Remove a portion of the second material within each trench of the first plurality of trenches to form a first plurality of voids

1020

Deposit a third material in the first plurality of trenches and the first plurality of voids, wherein a first region of the plurality of regions is isolated from a second region of the plurality of regions based at least in part on depositing the third material

ISOLATION REGIONS WITHIN A MEMORY DIE

FIELD OF TECHNOLOGY

The following relates to one or more systems for memory, including isolation regions within a memory die.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

BRIEF DESCRIPTION OF THE DRAWINGS

FIG. 10 shows a flowchart illustrating a method or methods that support isolation regions within a memory die in accordance with examples as disclosed herein.

DETAILED DESCRIPTION

In some memory manufacturing operations, a stack of material may be deposited over a substrate, such as a semiconductor substrate, and a plurality of pillars (e.g., memory pillars, strings of memory cells) may be formed in one or more regions through the stack of material. In some examples, the one or more regions may be separated by forming isolation regions interposed between respective regions. In some instances, operations (e.g., etching operations) related to forming the isolation regions may subject the stack of material to high stress. To mitigate failures due to high stress, support structures (e.g., structural pillars, dummy pillars) may be formed to provide structural support to the stack of material during manufacturing, in which structural pillars are formed by depositing a dielectric material in one or more rows of cavities. However, the structural pillars may occupy a relatively large space on the memory die, which may reduce memory cell density, and forming the support pillars may adversely affect manufacturing efficiency and the resulting memory structure.

In accordance with examples as disclosed herein, isolation regions may be formed in a manner which provides structural support to a stack of materials during manufacturing. For example, a first plurality of trenches extending in a first direction and a second plurality of trenches extending in a second direction may be formed through a stack of material. In some cases, first voids may be formed via the first plurality of trenches. The first voids may be relatively shallow (e.g., with respect to the first direction and the second direction), such that they mitigate stress applied to the stack of material. A dielectric material may be deposited in the first voids and the first plurality of trenches, forming first isolation regions (e.g., interposed between regions in the second direction). Subsequently, second voids may be formed via the second plurality of trenches, where the first isolation regions provide structural support to the stack of material during the formation of the second voids, and a dielectric material may be deposited in the second voids and the second plurality of trenches to form the second isolation regions. Accordingly, the first isolation regions may support the stack of material during subsequent etching operations, and relatively fewer (or no) support pillars may be used to support the memory die during fabrication. Additionally, the isolation regions may occupy a smaller proportion of the memory die than conventional support structures, further improving memory cell density and manufacturing efficiency.

Figure 1:
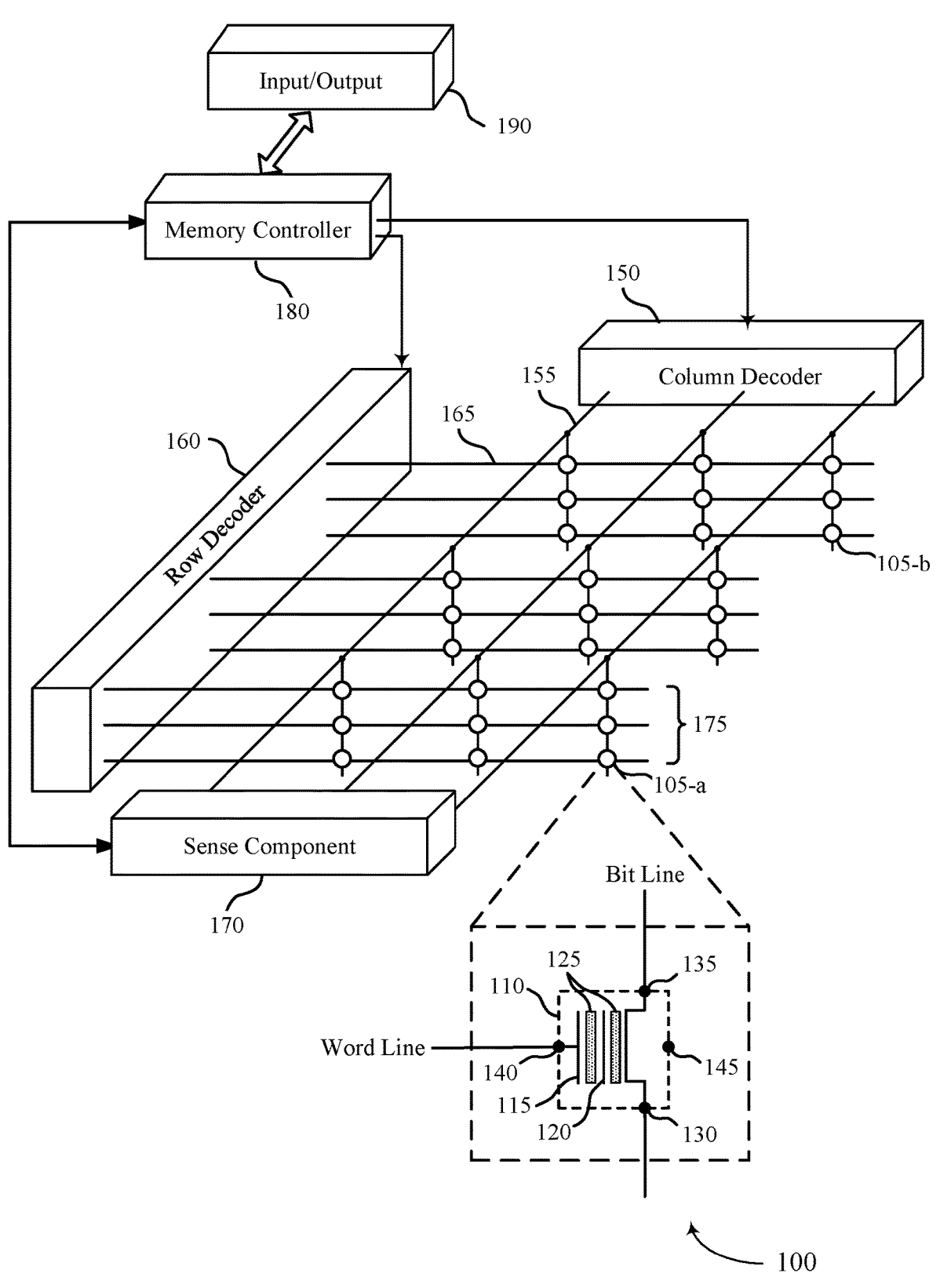
FIG. 1 illustrates an example of a system that supports isolation regions within a memory die in accordance with examples as disclosed herein.
Figure 2:
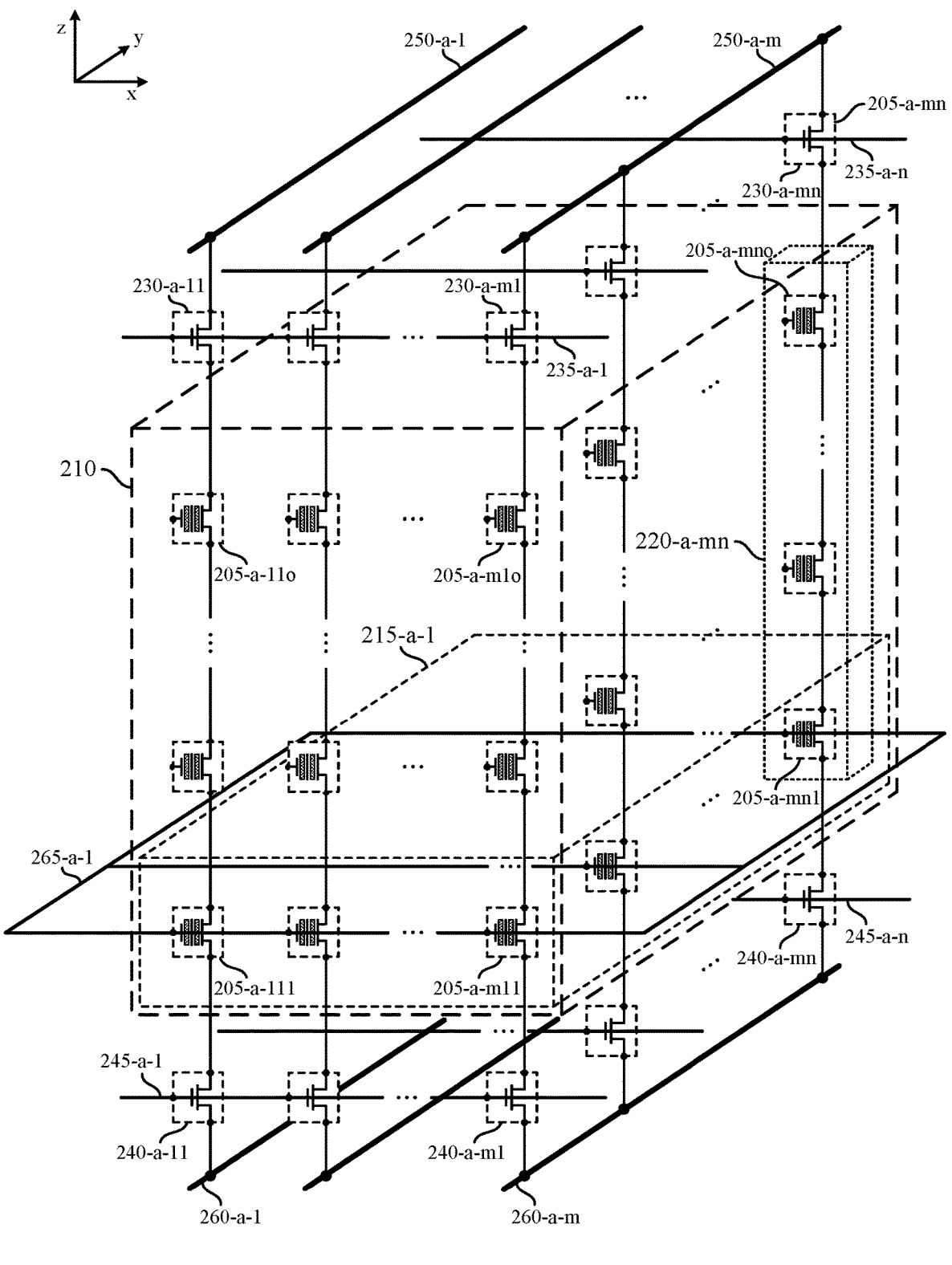
FIG. 2 illustrates an example of a memory architecture that supports isolation regions within a memory die in accordance with examples as disclosed herein.

Features of the disclosure are initially described in the context of systems, devices, and circuits with reference to FIGS. 1 and 2. Features of the disclosure are described in the context of fabrication operations and processing steps with reference to FIGS. 3 through 9. These and other features of the disclosure are further illustrated by and described in the context of a flowchart that relate to isolation regions within a memory die with reference to FIG. 10.

FIG. 1 illustrates an example of a memory device 100 that supports isolation regions within a memory die in accordance with examples as disclosed herein. FIG. 1 is an illustrative representation of various components and features of the memory device 100. As such, the components and features of the memory device 100 are shown to illustrate functional interrelationships, and not necessarily physical positions within the memory device 100. Further, although some elements included in FIG. 1 are labeled with a numeric indicator, some other corresponding elements are not labeled, even though they are the same or would be understood to be similar, in an effort to increase visibility and clarity of the depicted features.

The memory device 100 may include one or more memory cells 105, such as memory cell 105-*a* and memory cell 105-*b*. In some examples, a memory cell 105 may be a NAND memory cell, such as in the blow-up diagram of memory cell 105-*a*. Each memory cell 105 may be programmed to store a logic value representing one or more bits of information. In some examples, a single memory cell 105—such as a memory cell 105 configured as a single-level cell (SLC)—may be programmed to one of two supported states and thus may store one bit of information at a time (e.g., a logic 0 or a logic 1). In some other examples, a single memory cell 105—such a memory cell 105 configured as a multi-level cell (MLC), a tri-level cell (TLC), a quad-level cell (QLC), or other type of multiple-level memory cell 105—may be programmed to one of more than two supported states and thus may store more than one bit of information at a time. In some cases, a multiple-level memory cell 105 (e.g., an MLC memory cell, a TLC memory cell, a QLC memory cell) may be physically different than an SLC cell. For example, a multiple-level memory cell 105 may use a different cell geometry or may be fabricated using different materials. In some examples, a multiple-level memory cell 105 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays, each memory cell 105 may be illustrated as a transistor that includes a charge trapping structure (e.g., a floating gate, a replacement gate, a dielectric material) for storing an amount of charge representative of a logic value. For example, the blow-up in FIG. 1 illustrates a NAND memory cell 105-*a* that includes a transistor 110 (e.g., a metal-oxide-semiconductor (MOS) transistor) that may be used to store a logic value. The transistor 110 may include a control gate 115 and a charge trapping structure 120 (e.g., a floating gate, a replacement gate), where the charge trapping structure 120 may, in some examples, be between two portions of dielectric material 125. The transistor 110 also may include a first node 130 (e.g., a source or drain) and a second node 135 (e.g., a drain or source). A logic value may be stored in transistor 110 by storing (e.g., writing) a quantity of electrons (e.g., an amount of charge) on the charge trapping structure 120. An amount of charge to be stored on the charge trapping structure 120 may depend on the logic value to be stored. The charge stored on the charge trapping structure 120 may affect the threshold voltage of the transistor 110, thereby affecting the amount of current that flows through the transistor 110 when the transistor 110 is activated (e.g., when a voltage is applied to the control gate 115, when the memory cell 105-*a* is read). In some examples, the charge trapping structure 120 may be an example of a floating gate or a replacement gate that may be part of a 2D NAND structure. For example, a 2D NAND array may include multiple control gates 115 and charge trapping structures 120 arranged around a single channel (e.g., a horizontal channel, a vertical channel, a columnar channel, a pillar channel).

A logic value stored in the transistor 110 may be sensed (e.g., as part of a read operation) by applying a voltage to the control gate 115 (e.g., to control node 140, via a word line

165) to activate the transistor 110 and measuring (e.g., detecting, sensing) an amount of current that flows through the first node 130 or the second node 135 (e.g., via a bit line 155). For example, a sense component 170 may determine whether an SLC memory cell 105 stores a logic 0 or a logic 1 in a binary manner (e.g., based on a presence or absence of a current through the memory cell 105 when a read voltage is applied to the control gate 115, based on whether the current is above or below a threshold current). For a multiple-level memory cell 105, a sense component 170 may determine a logic value stored in the memory cell 105 based on various intermediate threshold levels of current when a read voltage is applied to the control gate 115, or by applying different read voltages to the control gate and evaluating different resulting levels of current through the transistor 110, or various combinations thereof. In one example of a multiple-level architecture, a sense component 170 may determine the logic value of a TLC memory cell 105 based on eight different levels of current, or ranges of current, that define the eight potential logic values that could be stored by the TLC memory cell 105.

An SLC memory cell 105 may be written by applying one of two voltages (e.g., a voltage above a threshold or a voltage below a threshold) to memory cell 105 to store, or not store, an electric charge on the charge trapping structure 120 and thereby cause the memory cell 105 store one of two possible logic values. For example, when a first voltage is applied to the control node 140 (e.g., via a word line 165) relative to a bulk node 145 (e.g., a body node) for the transistor 110 (e.g., when the control node 140 is at a higher voltage than the bulk), electrons may tunnel into the charge trapping structure 120. Injection of electrons into the charge trapping structure 120 may be referred to as programming the memory cell 105 and may occur as part of a write operation. A programmed memory cell may, in some cases, be considered as storing a logic 0. When a second voltage is applied to the control node 140 (e.g., via the word line 165) relative to the bulk node 145 for the transistor 110 (e.g., when the control node 140 is at a lower voltage than the bulk node 145), electrons may leave the charge trapping structure 120. Removal of electrons from the charge trapping structure 120 may be referred to as erasing the memory cell 105 and may occur as part of an erase operation. An erased memory cell may, in some cases, be considered as storing a logic 1. In some cases, memory cells 105 may be programmed at a page level of granularity due to memory cells 105 of a page sharing a common word line 165, and memory cells 105 may be erased at a block level of granularity due to memory cells 105 of a block sharing commonly biased bulk nodes 145.

In contrast to writing an SLC memory cell 105, writing a multiple-level (e.g., MLC, TLC, or QLC) memory cell 105 may involve applying different voltages to the memory cell 105 (e.g., to the control node 140 or bulk node 145 thereof) at a finer level of granularity to more finely control the amount of charge stored on the charge trapping structure 120, thereby enabling a larger set of logic values to be represented. Thus, multiple-level memory cells 105 may provide greater density of storage relative to SLC memory cells 105 but may, in some cases, involve narrower read or write margins or greater complexities for supporting circuitry.

A charge-trapping NAND memory cell 105 may operate similarly to a floating-gate NAND memory cell 105 but, instead of or in addition to storing a charge on a charge trapping structure 120, a charge-trapping NAND memory cell 105 may store a charge representing a logic state in a dielectric material between the control gate 115 and a channel (e.g., a channel between a first node 130 and a second node 135). Thus, a charge-trapping NAND memory cell 105 may include a charge trapping structure 120, or may implement charge trapping functionality in one or more portions of dielectric material 125, among other configurations.

In some examples, each page of memory cells 105 may be connected to a corresponding word line 165, and each column of memory cells 105 may be connected to a corresponding bit line 155 (e.g., digit line). Thus, one memory cell 105 may be located at the intersection of a word line 165 and a bit line 155. This intersection may be referred to as an address of a memory cell 105. In some cases, word lines 165 and bit lines 155 may be substantially perpendicular to one another, and may be generically referred to as access lines or select lines.

In some cases, a memory device 100 may include a three-dimensional (3D) memory array, where multiple two-dimensional (2D) memory arrays may be formed on top of one another. In some examples, such an arrangement may increase the quantity of memory cells 105 that may be fabricated on a single die or substrate as compared with 1D arrays, which, in turn, may reduce production costs, or increase the performance of the memory array, or both. In the example of FIG. 1, memory device 100 includes multiple levels (e.g., decks, layers, planes, tiers) of memory cells 105. The levels may, in some examples, be separated by an electrically insulating material. Each level may be aligned or positioned so that memory cells 105 may be aligned (e.g., exactly aligned, overlapping, or approximately aligned) with one another across each level, forming a memory cell stack 175. In some cases, memory cells aligned along a memory cell stack 175 may be referred to as a string of memory cells 105 (e.g., as described with reference to FIG. 2).

Accessing memory cells 105 may be controlled through a row decoder 160 and a column decoder 150. For example, the row decoder 160 may receive a row address from the memory controller 180 and activate an appropriate word line 165 based on the received row address. Similarly, the column decoder 150 may receive a column address from the memory controller 180 and activate an appropriate bit line 155. Thus, by activating one word line 165 and one bit line 155, one memory cell 105 may be accessed. Upon accessing, a memory cell 105 may be read (e.g., sensed) by sense component 170. For example, the sense component 170 may be configured to determine the stored logic value of a memory cell 105 based on a signal generated by accessing the memory cell 105. The signal may include a current, a voltage, or both a current and a voltage on the bit line 155 for the memory cell 105 and may depend on the logic value stored by the memory cell 105. The sense component 170 may include various circuitry (e.g., transistors, amplifiers) configured to detect and amplify a signal (e.g., a current or voltage) on a bit line 155. The logic value of memory cell 105 as detected by the sense component 170 may be output via input/output component 190. In some cases, a sense component 170 may be a part of a column decoder 150 or a row decoder 160, or a sense component 170 may otherwise be connected to or in electronic communication with a column decoder 150 or a row decoder 160.

A memory cell 105 may be programmed or written by activating the relevant word line 165 and bit line 155 to enable a logic value (e.g., representing one or more bits of information) to be stored in the memory cell 105. A column decoder 150 or a row decoder 160 may accept data (e.g., from the input/output component 190) to be written to the memory cells 105. In the case of NAND memory, a memory cell 105 may be written by storing electrons in a charge trapping structure or an insulating layer.

A memory controller 180 may control the operation (e.g., read, write, re-write, refresh) of memory cells 105 through the various components (e.g., row decoder 160, column decoder 150, sense component 170). In some cases, one or more of a row decoder 160, a column decoder 150, and a sense component 170 may be co-located with a memory controller 180. A memory controller 180 may generate row and column address signals in order to activate a desired word line 165 and bit line 155. In some examples, a memory controller 180 may generate and control various voltages or currents used during the operation of memory device 100.

In some techniques for manufacturing a memory device 100 (e.g., for manufacturing a memory die that includes one or more aspects of the memory device 100), a stack of material may be deposited over a substrate, such as a semiconductor substrate, and a plurality of pillars (e.g., memory pillars, strings of memory cells 105) may be formed in one or more regions (e.g., regions of the memory device 100) through the stack of material. For example, a plurality of cavities may be formed through the stack of material in the one or more regions, and storage materials may be deposited in the plurality of cavities to form memory pillars. In some cases, a plurality of trenches may be formed through the stack of material (e.g., interposed between the one or more regions), and voids may be formed in the plurality of trenches (e.g., by removing layers of the stack of material). A dielectric material may be deposited in the voids and plurality of trenches, thereby forming isolation regions.

The isolation regions of a memory die used to support aspects of the memory device 100 may be formed in a manner which provides structural support to the memory die during fabrication. For example, a first plurality of trenches extending in a first direction and a second plurality of trenches extending in a second direction may be formed through the stack of material. In some cases, first voids may be formed via the first plurality of trenches. The first voids may be relatively shallow (e.g., with respect to the first direction and the second direction), and may mitigate stress that would otherwise be applied to the stack of material. A dielectric material may be deposited in the first voids and the first plurality of trenches, forming first isolation regions (e.g., interposed between regions in the second direction). Subsequently, second voids may be formed via the second plurality of trenches, where the first isolation regions provide structural support to the stack of material during the formation of the second voids, and a dielectric material may be deposited in the second voids and the second plurality of trenches to form second isolation regions. Accordingly, the first isolation regions may support the stack of material during subsequent etching operations, thus relatively fewer (or no) structural pillars may be used to support the memory die during fabrication. Furthermore, the isolation regions may occupy a smaller proportion of the memory die than conventional support structures (e.g., structural pillars), improving memory cell 105 density and manufacturing efficiency.

FIG. 2 illustrates an example of a memory architecture 200 that supports isolation regions within a memory die in accordance with examples as disclosed herein. The memory architecture 200 may be an example of a portion of a memory device, such as a memory device 100. Although some elements of a set of elements (e.g., an array of elements) are included in FIG. 2, some elements may be omitted for the sake of visibility and clarity of the depicted elements. Moreover, although some elements included in FIG. 2 are labeled with reference numbers, some other corresponding elements are not labeled, though they are the same or would be understood by a person having ordinary skill in the art to be similar. Aspects of the memory architecture 200 may be described with reference to an x-direction, a y-direction, and a z-direction of the illustrated coordinate system.

The memory architecture 200 includes a three-dimensional array of memory cells 205, which may be examples of memory cells 105 described with reference to FIG. 1 (e.g., transistors 110, NAND memory cells). In some examples, the memory cells 205 may be connected in a 3D NAND configuration. For example, the memory cells 205 may be included in a block 210, which may be arranged as a 3D array of m memory cells along the x-direction, n memory cells along the y-direction, and o memory cells along the z-direction. Each memory cell 205 may be located (e.g., addressed) in accordance with an index i along the x-direction, an index j along the y-direction, and an index k along the z-direction (e.g., for locating a memory cell 205-a-ijk). A memory device 100 may include any quantity of one or more blocks 210 in accordance with examples as disclosed herein, and different blocks 210 may be adjacent along the x-direction, along the y-direction, or along the z-direction, or any combination thereof.

In the example of memory architecture 200, the block 210 may be divided into a set of pages 215 (e.g., a quantity of o pages 215) along the z-direction, including a page 215-a-1 associated with memory cells 205-a-111 through 205-a-mn1. In some examples, each reference to FIG. 1), which may be coupled with a control gate 115 of each of the memory cells 205 of the page 215. For example, page 215-a-1 may be associated with a word line 265-a-1, and other pages 215-a-i may be associated with a different respective word line 265-a-i (not shown). In some examples, a word line 265 in accordance with the memory architecture 200 may be implemented as planar conductor (e.g., in an xy-plane) that is coupled with each of the memory cells 205 of the page 215.

In the example of memory architecture 200, the block 210 also may be divided into a set of strings 220 (e.g., a quantity of (m×n) strings 220) in an xy-plane, including a string 220-a-mn associated with memory cells 205-a-mn1 through 205-a-mno. In some examples, each string 220 may include a set of memory cells 205 connected in series (e.g., along the z-direction, in which a drain of one memory cell 205 in the string 220 may be coupled with a source of another memory cell 205 in the string 220). In some examples, memory cells 205 of a string 220 may be implemented along a common channel, such as a pillar channel (e.g., a columnar channel, a pillar of doped semiconductor) along the z-direction. Each memory cell 205 in a string 220 may be associated with a different word line 265, such that a quantity of word lines 265 in the memory architecture 200 may be equal to the quantity of memory cells 205 in a string 220. Accordingly, a string 220 may include memory cells 205 from multiple pages 215, and a page 215 may include memory cells 205 from multiple strings 220.

In some examples, memory cells 205 may be programmed (e.g., set to a logic 0 value) and read from in accordance with a granularity, such as at the granularity of the page 215, but may not be erasable (e.g., reset to a logic 1 value) in accordance with the granularity, such as the granularity of the page 215. For example, NAND memory may instead be erasable in accordance with a different (e.g., higher) level of granularity, such as at the level of granularity the block 210. In some cases, a memory cell 205 may be erased before it may be re-programmed. Different memory devices may have different read, write, or erase characteristics.

In some examples, each string 220 of a block 210 may be coupled with a respective transistor 230 (e.g., a string select transistor, a drain select transistor) at one end of the string 220 (e.g., along the z-direction) and a respective transistor 240 (e.g., a source select transistor, a ground select transistor) at the other end of the string 220. In some examples, a drain of each transistor 230 may be coupled with a bit line 250 of a set of bit lines 250 associated with the block 210, where the bit lines 250 may be examples of bit lines 155 described with reference to FIG. 1. A gate of each transistor 230 may be coupled with a select line 235 (e.g., a string select line, a drain select line). Thus, a transistor 230 may be used to couple a string 220 with a bit line 250 based on applying a voltage to the select line 235, and thus to the gate of the transistor 230. Although illustrated as separate lines along the x-direction, in some examples, select lines 235 may be common to all the transistors 230 associated with the block 210 (e.g., a commonly biased string select node). For example, like the word lines 265 of the block 210, select lines 235 associated with the block 210 may, in some examples, be implemented as a planar conductor (e.g., in an xy-plane) that is coupled with each of the transistors 230 associated with the block 210.

In some examples, a source of each transistor 240 associated with the block 210 may be coupled with a source line 260 of a set of source lines 260 associated with the block 210. In some examples, the set of source lines 260 may be associated with a common source node (e.g., a ground node) corresponding to the block 210. A gate of each transistor 240 may be coupled with a select line 245 (e.g., a source select line, a ground select line). Thus, a transistor 240 may be used to couple a string 220 with a source line 260 based on applying a voltage to the select line 245, and thus to the gate of the transistor 240. Although illustrated as separate lines along the x-direction, in some examples, select lines 245 also may be common to all the transistors 240 associated with the block 210 (e.g., a commonly biased ground select node). For example, like the word lines 265 of the block 210, select lines 245 associated with the block 210 may, in some examples, be implemented as a planar conductor (e.g., in an xy-plane) that is coupled with each of the transistors 240 associated with the block 210.

To operate the memory architecture 200 (e.g., to perform a program operation, a read operation, or an erase operation on one or more memory cells 205 of the block 210), various voltages may be applied to one or more select lines 235 (e.g., to the gate of the transistors 230), to one or more bit lines 250 (e.g., to the drain of one or more transistors 230), to one or more word lines 265, to one or more select lines 245 (e.g., to the gate of the transistors 240), to one or more source lines 260 (e.g., to the source of the transistors 240), or to a bulk for the memory cells 205 (not shown) of the block 210. In some cases, each memory cell 205 of a block 210 may have a common bulk, the voltage of which may be controlled independently of bulks for other blocks 210.

In some cases, as part of a read operation for a memory cell 205, a positive voltage may be applied to the corresponding bit line 250 while the corresponding source line 260 may be grounded or otherwise biased at a voltage lower than the voltage applied to the bit line 250. In some examples, voltages may be concurrently applied to the select line 235 and the select line 245 that are above the threshold voltages of the transistor 230 and the transistor 240, respectively, for the memory cell 205, thereby activating the transistor 230 and transistor 240 such that a channel associated with the string 220 that includes the memory cell 205 (e.g., a pillar channel) may be electrically connected with (e.g., electrically connected between) the corresponding bit line 250 and source line 260. A channel may be an electrical path through the memory cells 205 in the string 220 (e.g., through the sources and drains of the transistors in the memory cells 205 of the string 220) that may conduct current under some operating conditions.

In some examples, multiple word lines 265 (e.g., in some cases all word lines 265) of the block 210—except a word line 265 associated with a page 215 of the memory cell 205 to be read—may concurrently be set to a voltage (e.g., VREAD) that is higher than the threshold voltage (VT) of the memory cells 205. VREAD may cause all memory cells 205 in the unselected pages 215 be activated so that each unselected memory cell 205 in the string 220 may maintain high conductivity within the channel. In some examples, the word line 265 associated with the memory cell 205 to be read may be set to a voltage, VTarget. Where the memory cells 205 are operated as SLC memory cells, VTarget may be a voltage that is between (i) VT of a memory cell 205 in an erased state and (ii) VT of a memory cell 205 in a programmed state.

When the memory cell 205 to be read exhibits an erased VT (e.g., VTarget>VT of the memory cell 205), the memory cell 205 may turn "ON" in response to the application of VTarget to the word line 265 of the selected page 215, which may allow a current to flow in the channel of the string 220, and thus from the bit line 250 to the source line 260. When the memory cell 205 to be read exhibits a programmed VT (e.g., VTarget<VT of the selected memory cell), the memory cell 205 may remain "OFF" despite the application of VTarget to the word line 265 of the selected page 215, and thus may prevent a current from flowing in the channel of the string 220, and thus from the bit line 250 to the source line 260.

A signal on the bit line 250 for the memory cell 205 (e.g., an amount of current below or above a threshold) may be sensed (e.g., by a sense component 170 as described with reference to FIG. 1), and may indicate whether the memory cell 205 became conductive or remained non-conductive in response to the application of VTarget to the word line 265 of the selected page 215. The sensed signal thus may be indicative of whether the memory cell 205 was in an erased state (e.g., storing a logic 1) or a programmed state (e.g., storing a logic Though aspects of the example read operation above have been explained in the context of an SLC memory cell 205 for clarity, such techniques may be extended or altered and applied in the context of a multiple-level memory cell 205 (e.g., through the use of multiple values of VTarget corresponding to the different amounts of charge that may be stored in one multiple-level memory cell 205).

In some cases, as part of a program operation for a memory cell 205, charge may be added to a portion of the memory cell 205 such that current flow through the memory cell 205, and thus the corresponding string 220, may be inhibited when the memory cell 205 is later read. For example, charge may be injected into a charge trapping structure 120 as shown in memory cell 105-*a* of FIG. 1. In some cases, respective voltages may be applied to the word line 265 of the page 215 and the bulk of the memory cell 205 to be programmed such that a control gate 115 of the memory cell 205 is at a higher voltage than the bulk of the memory cell 205 (e.g., a positive voltage may be applied to the word line). Concurrently, voltages may be applied to the select line 235 and the select line 245 that are above the threshold voltages of the transistor 230 and the transistor 240, respectively, thereby activating the transistor 230 and the transistor 240, and the bit line 250 for the memory cell 205 to be programmed may be set to a relatively high voltage. This may cause an electric field such that electrons are pulled from the source of the memory cell 205 towards the drain. The electric field may also cause some of these electrons to be pulled through dielectric material 125 and thereby injected into the charge trapping structure 120 of the memory cell 205, through a process which may in some cases be referred to as tunnel injection.

In some cases, a single program operation may program some or all memory cells 205 in a page 215, as the memory cells 205 of the page 215 may all share a common word line 265 and a common bulk. For a memory cell 205 of the page 215 for which it is not desired to write a logic 0 (e.g., not desired to program the memory cell 205), the corresponding bit line 250 may be set to a relatively low voltage (e.g., ground), which may inhibit the injection of electrons into a charge trapping structure 120. Though aspects of the example program operation above have been explained in the context of an SLC memory cell 205 for clarity, such techniques may be extended and applied to the context of a multiple-level memory cell 205 (e.g., through the use of multiple programming voltages applied to the word line 265, or multiple passes or pulses of a programming voltage applied to the word line 265, corresponding to the different amounts of charge that may be stored in one multiple-level memory cell 205).

In some cases, as part of an erase operation for a memory cell 205, charge may be removed from a portion of the memory cell 205 such that current flow through the memory cell 205, and thus the corresponding string 220, may be uninhibited (e.g., allowed, at least to a greater extent) when the memory cell 205 is later read. For example, charge may be removed from a charge trapping structure 120 as shown in memory cell 105-*a* of FIG. 1. In some cases, respective voltages may be applied to the word line 265 of the page 215 and the bulk of the memory cell 205 to be erased such that a control gate 115 of the memory cell 205 is at a lower voltage than the bulk of the memory cell 205 (e.g., a positive voltage may be applied to the bulk), which may cause an electric field that pulls electrons out of the charge trapping structure 120 and into the bulk of the memory cell 205. In some cases, a single program operation may erase all memory cells 205 in a block 210, as the memory cells 205 of the block 210 may all share a common bulk.

In some cases, electron injection and removal processes associated with program and erase operations may cause stress on a memory cell 205 (e.g., on the dielectric material 125). Over time, such stress may in some cases cause one or more aspects of the memory cell 205 (e.g., the dielectric material 125) to deteriorate. For example, charge trapping structure 120 may become unable to maintain a stored charge. Such deterioration may be an example of a wearout mechanism for a memory cell 205, and for this or other reasons, some memory cells 205 may support a finite quantity of program and erase cycles.

In some techniques for manufacturing the memory architecture 200, a stack of material may be deposited over a substrate, such as a semiconductor substrate, and a plurality of pillars (e.g., memory pillars, strings 220) may be formed in one or more regions (e.g., blocks 210) through the stack of material. For example, a plurality of cavities may be formed through the stack of material in the one or more regions, and storage materials may be deposited in the plurality of cavities to form memory pillars. In some cases, a plurality of trenches may be formed through the stack of material (e.g., interposed between the one or more regions), and voids may be formed in the plurality of trenches (e.g., by removing layers of the stack of material). A dielectric material may be deposited in the voids and plurality of trenches, thereby forming isolation regions (e.g., between regions of the memory array, between active portions of a memory die).

The isolation regions of a memory die that supports the memory architecture 200 may be formed in a manner which provides structural support to the memory die during fabrication. For example, a first plurality of trenches extending in a first direction and a second plurality of trenches extending in a second direction may be formed through the stack of material. In some cases, first voids may be formed via the first plurality of trenches. The first voids may be relatively shallow (e.g., with respect to the first direction and the second direction), and may mitigate stress that would otherwise be applied to the stack of material. A dielectric material may be deposited in the first voids and the first plurality of trenches, forming first isolation regions (e.g., interposed between regions in the second direction). Subsequently, second voids may be formed via the second plurality of trenches, where the first isolation regions provide structural support to the stack of material during the formation of the second voids, and a dielectric material may be deposited in the second voids and the second plurality of trenches to form second isolation regions. Accordingly, the first isolation regions may support the stack of material during subsequent etching operations, thus relatively fewer (or no) structural pillars may be used to support the memory die during fabrication. Furthermore, the isolation regions may occupy a smaller proportion of the memory die than conventional support structures (e.g., structural pillars), improving memory cell 205 density and manufacturing efficiency.

Figure 3:
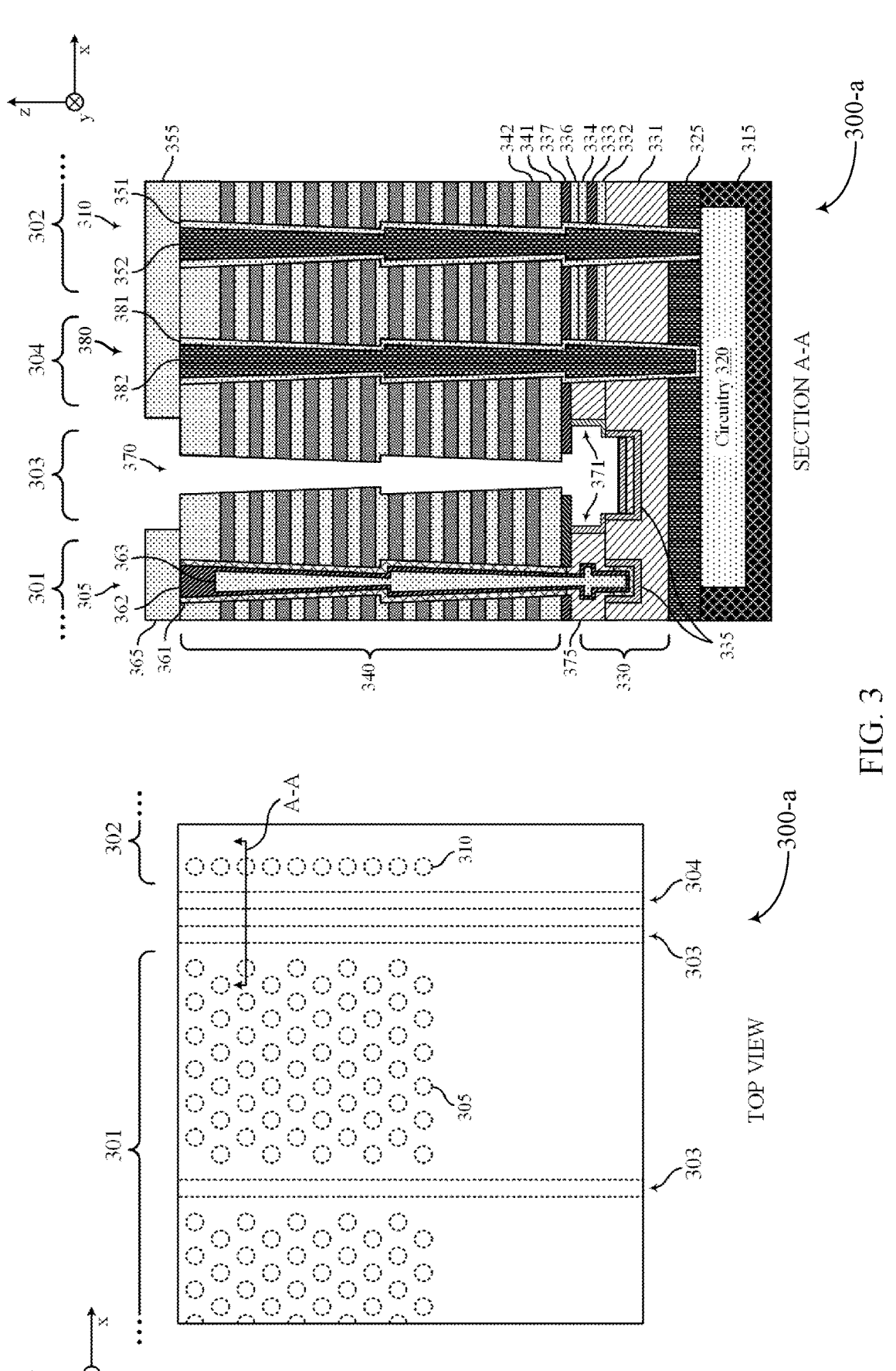
FIGS. 3 through 5 illustrate examples of fabrication operations that supports isolation regions within a memory die in accordance with examples as disclosed herein.
Figure 4:
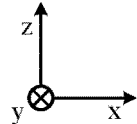
Figure 4:
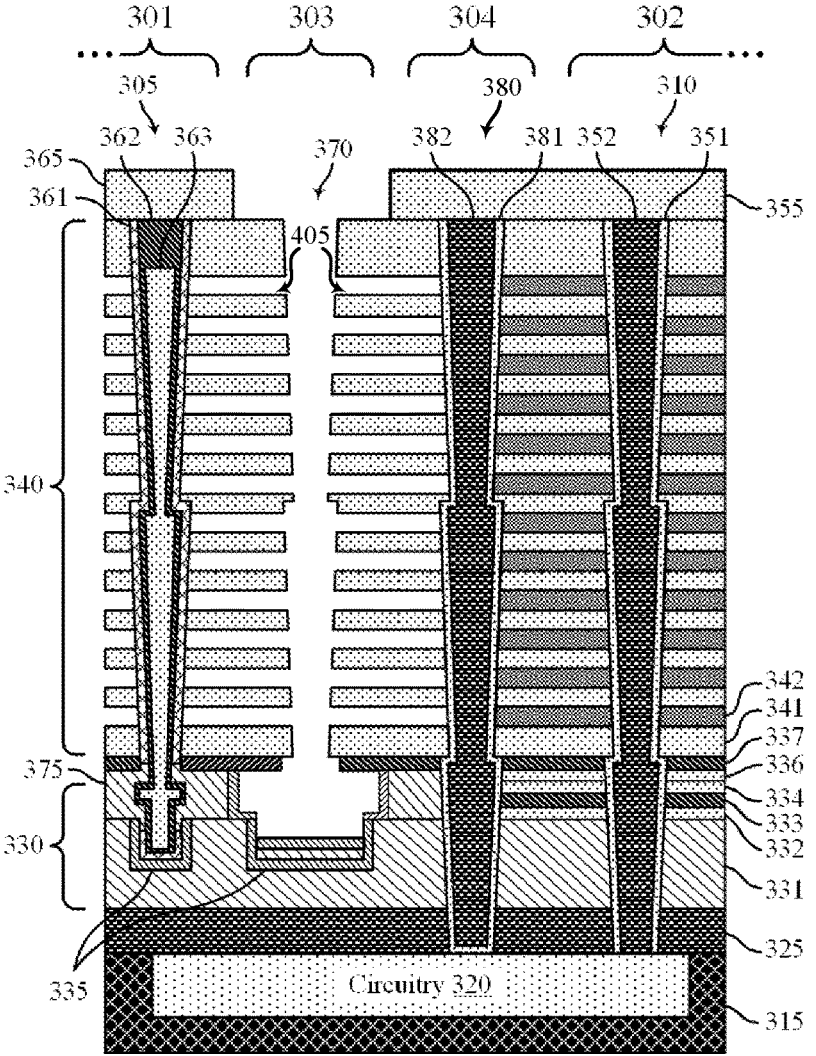
Figure 5:
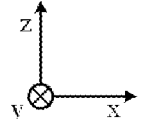
Figure 5:
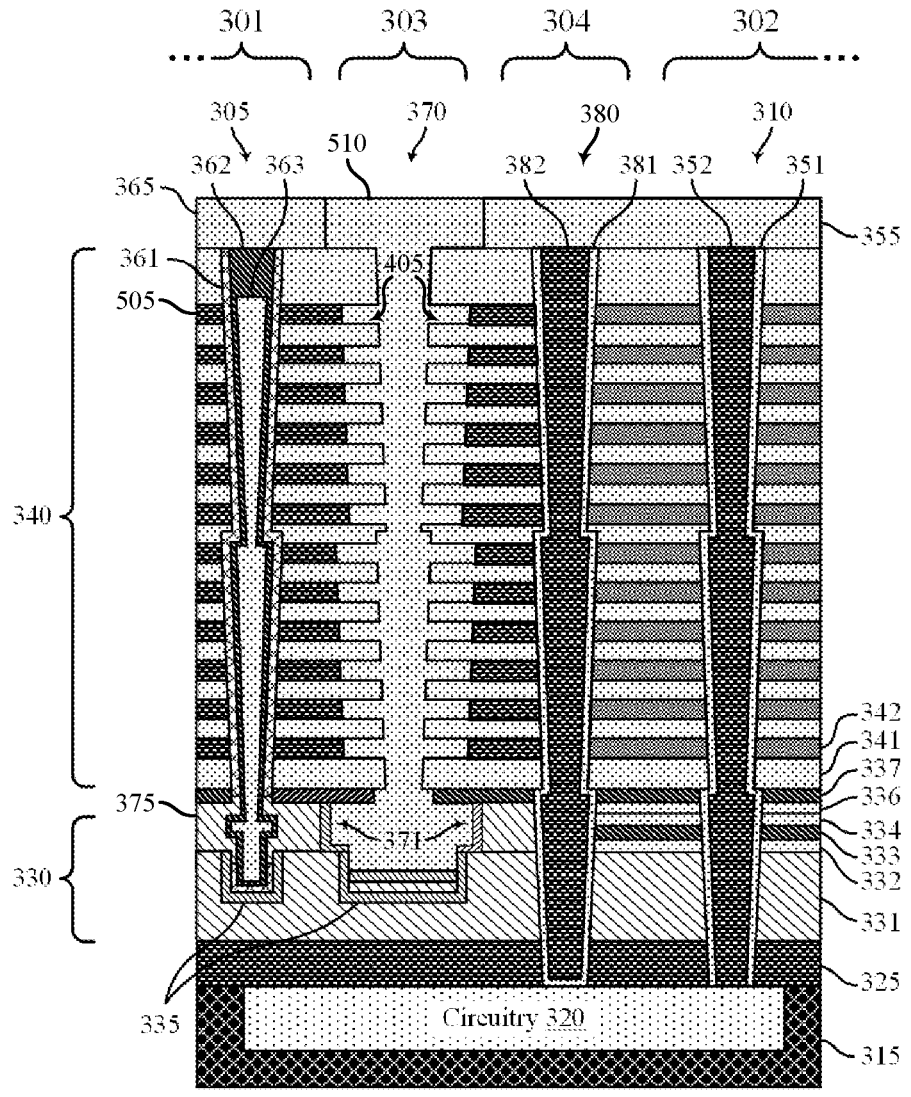

FIGS. 3 through 5 illustrate examples of fabrication operations that may support isolation regions within a memory die in accordance with examples as disclosed herein. For example, FIGS. 3 through 5 may illustrate aspects of a sequence of operations for fabricating aspects of a material arrangement 300, which may be an example of implementing aspects of a memory architecture 200 described with reference to FIG. 2, among other types of memory architectures. Each of FIGS. 3 through 5 may illustrate aspects of the material arrangement 300 after different subsets of the fabrication operations for forming the material arrangement 300 (e.g., illustrated as a material arrangement 300-*a* after a first set of one or more manufacturing operations, as a material arrangement 300-*b* after a second set of one or more manufacturing operations, and so on). Each view of the figures may be described with reference to an x-direction, a y-direction, and a z-direction as illustrated, which may correspond to the respective directions described with reference to the memory architecture 200.

Some of the provided figures include section views that illustrate example cross-sections of the material arrangement 300. For example, in FIGS. 3 through 5, a view "SECTION A-A" may be associated with a cross-section in an xz-plane (e.g., in accordance with a cut plane A-A) through a portion of the material arrangement 300 associated with one or more cavities (e.g., including a cavity for a memory cell 205 and a cavity for an electrical contact through at least a portion of the material arrangement 300). Although the material arrangement 300 illustrates examples of relative dimensions and quantities of various features, aspects of the material arrangement 300 may be implemented with other relative dimensions or quantities of such features in accordance with examples as disclosed herein.

Operations illustrated in and described with reference to FIGS. 3 through 5 may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

FIG. 3 illustrates the material arrangement 300 (e.g., as a material arrangement 300-*a*) after a first set of one or more manufacturing operations. As illustrated, the material arrangement 300 may be associated with regions 301 (e.g., an array region, associated with one or more blocks 210), including pillars 305 that are associated with an array of memory cells 205, and regions 302 (e.g., a contact region), including electrical contacts 310 that may convey signals associated with accessing the memory cells 205, each extending through at least a portion of the material arrangement 300 along the z-direction. In the material arrangement 300, some features of the regions 301 and regions 302 may be electrically isolated from one another, which may be supported by isolation regions 303 or isolation regions 304 (e.g., trench isolation regions), or various combinations thereof.

The first set of operations may include forming a layer of a material 325 (e.g., depositing the material 325 over a substrate 315), which may include a conductive material (e.g., a metal, a metal alloy, an electrically conductive ceramic such as tungsten silicide). In some examples, the layer of material 325 may support a ground node of a memory architecture 200, such as a source node of one or more blocks 210 (e.g., source lines 260, a common source). Although the layer of material 325 may be deposited in contact with the substrate 315, in some other examples, the material arrangement 300 may include other materials or components between the layer of material 325 and the substrate 315. The substrate 315 may include or be otherwise associated with circuitry 320, which may include interconnection or routing circuitry (e.g., access lines, power routing lines), control circuitry (e.g., transistors, logic, decoding circuitry, addressing circuitry, aspects of a memory controller 180, a column decoder 150, a row decoder 160, a sense component 170, an input/output component 190), among other circuitry, which may include various conductor, semiconductor, or dielectric materials of the substrate 315, or between the layer of material 325 and the substrate 315, among other configurations. For example, the circuitry 320 may include an arrangement of complementary metal-oxide semiconductor (CMOS) transistors, or thin-film-transistors (TFTs), or any combination thereof between the substrate 315 and the layer of material 325, among others.

The first set of operations may also include depositing a stack 330 (e.g., a stack of material layers) over the substrate 315 (e.g., over the layer of material 325), which may support formation of various components that support the access of memory cells 205 (e.g., in array regions 301). In some examples, the stack 330 may include a layer of a material 331, a layer of a material 332, a layer of a material 333, and a layer of a material 334. In some examples, the material 331 may be a semiconductor material (e.g., doped polysilicon, n+ doped polysilicon), which may support forming a channel portion of transistors 240. In some examples, each of the material 332, the material 333, and the material 334 may be a sacrificial material, at least a portion of which may be patterned and removed in later processing operations. In some examples, the material 332, the material 333, and the material 334 may be selected to support various techniques for differential processing (e.g., differential etching, high selectivity). For example, the material 332 may be a dielectric material (e.g., an oxide, an oxide of silicon, a liner oxide), the material 333 may be a semiconductor material (e.g., polysilicon), and the material 334 may be a dielectric material (e.g., an oxide, an oxide of silicon, a cap oxide) that may be the same as the material 332.

In some examples, the first set of operations may include operations that support forming etch stops in the stack 330 (e.g., vertical etch stops, to prevent material removal beyond the stack 330 in at least some regions of the material arrangement 300). For example, the first set of operations may include various operations for forming cavities aligned (e.g., in an xy-plane) with locations of the pillars 305, and forming trenches aligned along locations of the isolation regions 303. In some examples, such trenches may be connected with other such trenches (e.g., along the x-direction) to provide a trench isolation around each portion of the material arrangement 300 that is associated with a block 210 (e.g., enclosing an area in an xy-plane associated with a block 210, enclosing regions 301 or some portion thereof). Such cavities and trenches may extend at least in part through the layer of the material 321, supporting the formation of a material 335 (e.g., oxidized doped polysilicon, which may include oxidizing the material 331) along the bottom and sidewalls of the cavities and trenches. In some examples, after forming etch stop features in the stack 330, the first set of operations may include depositing a layer of a material 336 and a layer of a material 337 over the stack 330. The material 336 may be an oxide material (e.g., an oxide of silicon), and the material 337 may be a semiconductor material (e.g., polysilicon). In some examples, the material 336 may be a sacrificial material (e.g., with portions removed in one or more later operations), and the material 337 may support formation of one or more transistor structures (e.g., as part of a channel of transistors 240 of the memory architecture 200).

The first set of operations also may include depositing a stack 340 (e.g., a stack of material), which may include various deposition operations. For example, depositing the stack 340 may include depositing alternating layers of a material 341 (e.g., first material) and a material 342 (e.g., second material, in accordance with alternating material deposition operations). In some examples, the material 341 may include a dielectric material (e.g., an oxide, a tier oxide, an oxide of silicon), which may provide electrical isolation between features of the material arrangement 300 (e.g., between pages 215, between word lines 265, along the z-direction). The material 342 may include various materials that are different than the material 341 (e.g., a nitride material, a nitride of silicon), and may be a sacrificial material (e.g., to support subsequent differential etching procedures). Although the stack 340 is illustrated with twenty five layers (e.g., thirteen layers of the material 341 and twelve layers of the material 342), a stack 340 in accordance with examples as disclosed herein may include any quantity of layers of each of two or more materials (e.g., tens of layers, hundreds of layers, and so on), including as few as one layer of the material 342.

The first set of operations also may include various operations for forming the contacts 310. For example, the first set of operations may include operations (e.g., dry etching operations, photolithography operations) for forming cavities through the stack 340 and the stack 330 in the regions 302 (e.g., exposing electrical contacts, such as conductive material portions, associated with the circuitry 320). Such cavities may be formed in various patterns associated with the contacts 310. In some examples, a cavity for a contact 310 may be aligned along the y-direction with a corresponding set of pillars 305 (e.g., a row of pillars 305 along the x-direction), which may support the contact 310 being coupled with a bit line 250 formed above (e.g., along the z-direction) the corresponding set of pillars 305. However, contacts 310 may be formed in a region 302 for other purposes, and accordingly may be arranged in various other configurations. The cavities may be formed via openings (e.g., cross-sectional openings, openings in an xy-plane) that are non-overlapping with one another (e.g., in an xy-plane). Forming cavities for the contacts 310 may be associated with forming (e.g., exposing) sidewalls of one or more materials of the stack 340 and of the stack 330, and such sidewalls may have a shape that is tapered along the z-direction.

Although, in some examples, cavities for contacts 310 may be formed through the stack 340 and the stack 330 in a single material removal operation, in some other examples, such cavities may be formed using a sequence of material removal operations. For example, for each contact 310, a respective first cavity may be formed through at least the stack 330 and, in some examples, one or both of the material 336 or the material 337, and the first cavity may be filled with a sacrificial material (e.g., sacrificial carbon, with or without a liner material, or a stack of different materials). In some examples, such operations may be performed before depositing the stack 340. A respective second cavity, aligned with the respective first cavity (e.g., coaxial along the z-direction, in accordance with an alignment tolerance in an xy-plane), may be formed through at least a subset of material layers of the stack 340 (e.g., before deposition of another subset of material layers of the stack 340), and the second cavity may be filled with a sacrificial material (e.g., coincident with previously-deposited sacrificial material, over which another subset of material layers of the stack 340 may be deposited). Such a sequence may be repeated for any quantity of iterations and a single, collective cavity for each contact 310 may be formed by removing the sacrificial material from the earlier cavity fill operations.

After forming such cavities, the contacts 310 may formed at least in part by depositing a conductive material in the cavities. In some examples, such operations may include depositing a material 351, which may include a dielectric material (e.g., an oxide, an oxide of silicon). In examples that include the material 351, the material 351 may be removed from a bottom portion of the cavities to expose respective contacts of the circuitry 320. Forming the contacts 310 may then include depositing a material 352 (e.g., in contact with or otherwise electrically coupled with the circuitry 320), which may include a conductive material (e.g., a metal, a metal alloy, tungsten, tungsten silicide). In some examples, the material 352 may be the same as the material 325. In some examples, after forming the contacts 310, the first set of operations may include depositing a layer of a material 355 (e.g., a dielectric material, an oxide of silicon) over the stack 340, which may provide a barrier that protects the contacts 310 during subsequent operations.

The first set of operations also may include various operations for forming the pillars 305. For example, the first set of operations may include operations (e.g., dry etching operations, photolithography operations) for forming cavities through the stack 340 and through at least a portion of the stack 330 in regions 301 (e.g., exposing a portion of the material 325, using the material 325 as a cavity etch stop). Such cavities may be formed in a pattern associated with the pillars 305 (e.g., in rows along the x-direction), which may include a staggering of rows to improve density of pillars 305 (e.g., in an xy-plane). The cavities may be formed via openings that are non-overlapping with one another, and forming such cavities may be associated with forming sidewalls of one or more materials of the stack 340 and of the stack 330. In some examples, one or more operations associated with forming cavities for the pillars 305 may be performed concurrently with corresponding operations associated with forming cavities for the contacts 310 (e.g., etching operations, sacrificial material deposition operations).

Although, in some examples, such cavities may be formed through at least the stack 340 in a single material removal operation, in some other examples, such cavities may be formed using a sequence of material removal operations. For example, for each pillar 305, a respective first cavity may be formed through a first subset of material layers of the stack 340, and the first cavity may be filled with a sacrificial material (e.g., before depositing a second subset of material layers of the stack 340). A respective second cavity, aligned with the respective first cavity, may be formed through a second subset of material layers of the stack 340, and the second cavity may be filled with a sacrificial material. Such a sequence may be repeated for any quantity of iterations and a single, collective cavity for each pillar 305 may be formed by removing the sacrificial material from the earlier cavity fill operations After forming such cavities, the formation of pillars 305 may include various operations that support forming memory cells (e.g., memory cells 105, memory cells 205, memory cells of a string 220) associated with the pillars 305. For example, the first set of operations may include depositing at least a material 361 and a material 362, and, in some examples, a material 363 in the formed cavities associated with the pillars 305. The material 361 may support a charge-trapping function of memory cells 205 and, in various examples, may include one or more layers of material. In some examples, the material 361 may include a first layer (e.g., a dielectric layer, an oxide layer, an oxide of silicon) in contact with walls of the formed cavities, which may support first dielectric materials 125 of a string of memory cells 205, a second layer (e.g., a charge-trapping layer, a nitride layer, a nitride of silicon) over the first layer, which may support charge trapping structures 120 of the string of memory cells 205, and a third layer (e.g., a dielectric layer, an oxide layer, an oxide of silicon) over the second layer, which may support second dielectric materials 125 of the string of memory cells 205. The material 362 may be a semiconductor material (e.g., polysilicon, in contact with the material 361 or third layer thereof), which may support channel portions of the string of memory cells 205 (e.g., between respective first nodes 130 and second nodes 135). The material 363 may be a dielectric material (e.g., silicon oxide, in contact with the material 362) which, in some examples, may fill a remainder of the cavities. In some examples, a portion of at least the material 363 may be removed (e.g., recessed) from the top of the pillars 305 and an additional portion of the material 362 may be deposited to fill the top portions of the pillars 305 (e.g., in a plug formation operation). In some examples, after forming the pillars 305, the first set of operations may include depositing a layer of a material 365 (e.g., a dielectric, material an oxide of silicon) over the stack 340, which may provide a barrier that protects the pillars 305 during subsequent operations.

The first set of operations also may include various operations (e.g., dry etching operations, photolithography operations) for forming trenches 370 through the stack 340 and through at least a portion of the stack 330 along the isolation regions 303 (e.g., exposing a portion of the material 325, using the material 325 as a trench etch stop). In some examples, one or more operations associated with forming trenches 370 for the isolation regions 303 may be performed concurrently with corresponding operations associated with forming cavities for the pillars 305 (e.g., etching operations, sacrificial material deposition operations). Although, in some examples, trenches 370 may be formed through at least the stack 340 in a single material removal operation, in some other examples, trenches 370 may be formed using a sequence of material removal operations. For example, for each isolation region 303, a respective first trench may be formed through a first subset of material layers of the stack 340, and the first trench may be filled with a sacrificial material (e.g., before depositing a second subset of material layers of the stack 340). A respective second trench, aligned with the respective first trench, may be formed through a second subset of material layers of the stack 340, and the second trench may be filled with a sacrificial material. Such a sequence may be repeated for any quantity of iterations and a trench 370 may be formed by removing the sacrificial material from the earlier trench fill operations. In some examples, forming trenches 370 may involve removing at least a portion of the material 355, or the material 365, from the isolation regions 303.

Opening the trenches 370 may support formation of structures associated with the pillars 305. For example, voids 371 may be formed via the trenches 370, which may include removing (e.g., via a wet etching operation) exposed portions of the material 332, the material 333, the material 334, the material 336, and the material 361. In some examples, such operations may be preceded by depositing a liner material (not shown) on surfaces of the stack 340 associated with the trenches 370, which may prevent removal of the material 341 and the material 342 during such operations. A material 375 may be deposited in the voids 371, which may further support forming aspects of transistors 240. For example, the material 375 may include a semiconductor material (e.g., a doped polysilicon material, an n+ doped polysilicon material), which may be the same as the material 331. In some examples, after depositing the material 375, a liner along the trench 370 may be removed, and exposed surfaces of the material 331 and the material 375 may be oxidized to form additional portions of the material 335.

In some examples, forming word lines 265 in the material arrangement 300 may involve forming voids by removing portions of the material 342 from the stack 340 in the regions 301, and depositing one or more conductive materials in the formed voids. However, extents of the removal of the material 342 (e.g., along the x-direction, along the y-direction) may be indeterminate or otherwise difficult to control due to variations in material removal rates and different material removal dimensions. Thus, in some examples, voids may extend into regions 302, among other regions (e.g., between adjacent regions 301 that are intended to be electrically isolated), which may allow conductive materials to be adversely deposited in contact with the contacts 310, among other features of the material arrangement.

In accordance with examples as disclosed herein, the material arrangement 300 may include isolation regions 304, which may provide structural support to the arrangement 300 during fabrication. To form features of the isolation regions 304, the first set of operations may include operations (e.g., dry etching operations, photolithography operations) for forming trenches 380 through at least the stack 340 and, in some examples, through the stack 330 and the layer of material 325, along the isolation regions 304. In some examples, one or more operations associated with forming trenches 380 for the isolation regions 304 may be performed concurrently with corresponding operations associated with forming cavities for the contacts 310 (e.g., etching operations, sacrificial material deposition operations). Although, in some examples, trenches 380 may be formed in a single material removal operation, in some other examples, trenches 380 may be formed using a sequence of material removal operations, in accordance with examples as disclosed herein (e.g., as described with reference to forming contacts 310).

After forming trenches 380, an etch stop feature may formed by depositing one or more materials in the trenches 380. In some examples, such operations may include depositing a material 381, which may include a dielectric material (e.g., an oxide, an oxide of silicon), followed by depositing a material 382, which may include a conductive material (e.g., a metal, a metal alloy, tungsten, tungsten silicide). In some examples, the material 381 may be the same as the material 351, and the material 382 may be the same as the material 352, such that respective deposition operations may be performed concurrently (e.g., forming the isolation regions 304 concurrently with forming the contacts 310). However, in some examples, a material 381 may remain at the bottom of trenches 380, which may support an electrical isolation between the material 382 and the circuitry 320.

In some examples, the isolation regions (e.g., isolation regions 303) may be formed in such a manner to provide structural support to the arrangement 300 during the first set of operations. For example, the isolation region may be formed in accordance with material arrangements as described with reference to FIGS. 6, 8 and 9, and a set of processes as described with reference to FIG. 7. A first set of the isolation regions 303 (e.g., first isolation regions) may extend in the x-direction (e.g., first direction) and a second portion of the isolation regions 303 (e.g., second isolation regions) may extend in the y-direction (e.g., second direction). The first isolation regions may be formed in accordance with a relatively shallow void formation and deposition processes, and may provide structural support during the formation of the second isolation regions. Because the first isolation regions may support the material arrangement 300 during fabrication, a quantity of support structures (e.g., structural pillars, dummy pillars) may be reduced or mitigated, and, as such, the material arrangement 300 may have a greater density of pillars 305 (e.g., and a lesser quantity of dummy pillars).

FIG. 4 illustrates the material arrangement 300 (e.g., as a material arrangement 300-*b*) after a second set of one or more manufacturing operations, as a cross-sectional side view (e.g., relative to the cut plane A-A). The second set of operations may include operations (e.g., wet etching operations, exhuming operations) that support forming word lines 265 in the regions 301. For example, the second set of operations may include forming voids 405 between layers of the material 341 by removing the material 342 from portions of the stack 340 (e.g., in the regions 301). Forming the voids 405 may expose portions of the pillars 305 (e.g., exposing sidewalls of the material 361 between layers of the material 341), which may remain in contact with the material 341 and support the material 341 across the voids 405 (e.g., along the z-direction) for the formation of various structures of the memory architecture 200. In some examples, the voids 405 may extend as far as the isolation regions 304, which may include exposing sidewalls of the material 381 between the layers of the material 341. However, by including isolation regions 304, the voids 405 may not extend into the regions 302, which may prevent the deposition of conductive materials in the regions 302 during the subsequent formation of other structures of the memory architecture 200.

FIG. 5 illustrates the material arrangement 300 (e.g., as a material arrangement 300-*c*) after a third set of one or more manufacturing operations, as a cross-sectional side view (e.g., relative to the cut plane A-A). The third set of operations may include additional or subsequent operations (e.g., one or more deposition operations, metal fill operations, etching operations, etc.) that support forming access lines or other structures between layers of the material 341 (e.g., in portions of the voids 405). For example, the third set of operations may also include depositing a material 505 in the voids 405 (e.g., between layers of material 341), which may include depositing the material 505 in contact with the pillars 305 (e.g., in contact with the material 361). The material 505 may include one or more conductive materials, such as tungsten, which may be the same as the material 325, material 351, or the material 381, or any combination thereof. In some examples, depositing the material 505 may include depositing a dielectric material (e.g., aluminum oxide) in contact with the pillars 305 (e.g., in contact with the material 361), which may support a dielectric function of memory cells 205 (e.g., a dielectric material 125). The material 505 may be etched (e.g., in a recess etch operation) back into the voids 405 to provide electrical isolation between structures of the memory architecture 200.

The third set of operations also may include operations (e.g., one or more deposition operations) that support forming an electrical isolation in the isolation regions 303 based on depositing a material 510 in regions 303 (e.g., in the trenches 370 and at least some portion of the voids 405). The material 510 may be a dielectric material (e.g., an oxide, an oxide of silicon) which may be the same as the material 355 or the material 365.

The third set of operations may be followed by other operations to support aspects of the memory architecture 200, such as forming bit lines 250 coupled with the strings 220 (e.g., conductive lines over the material arrangement 300-*c*, which may be aligned along the x-direction and operable for coupling between the material 362 and the material 352), forming word lines 265 coupled with the memory cells 205 (e.g., conductive lines through the material arrangement 300-*c*), and forming vertical contacts (e.g., vertical conductors) coupled with each of the word lines 265 (e.g., contacts electrically coupled with respective layers of material 505), among other features.

Figures 6A, 6B, 6C:
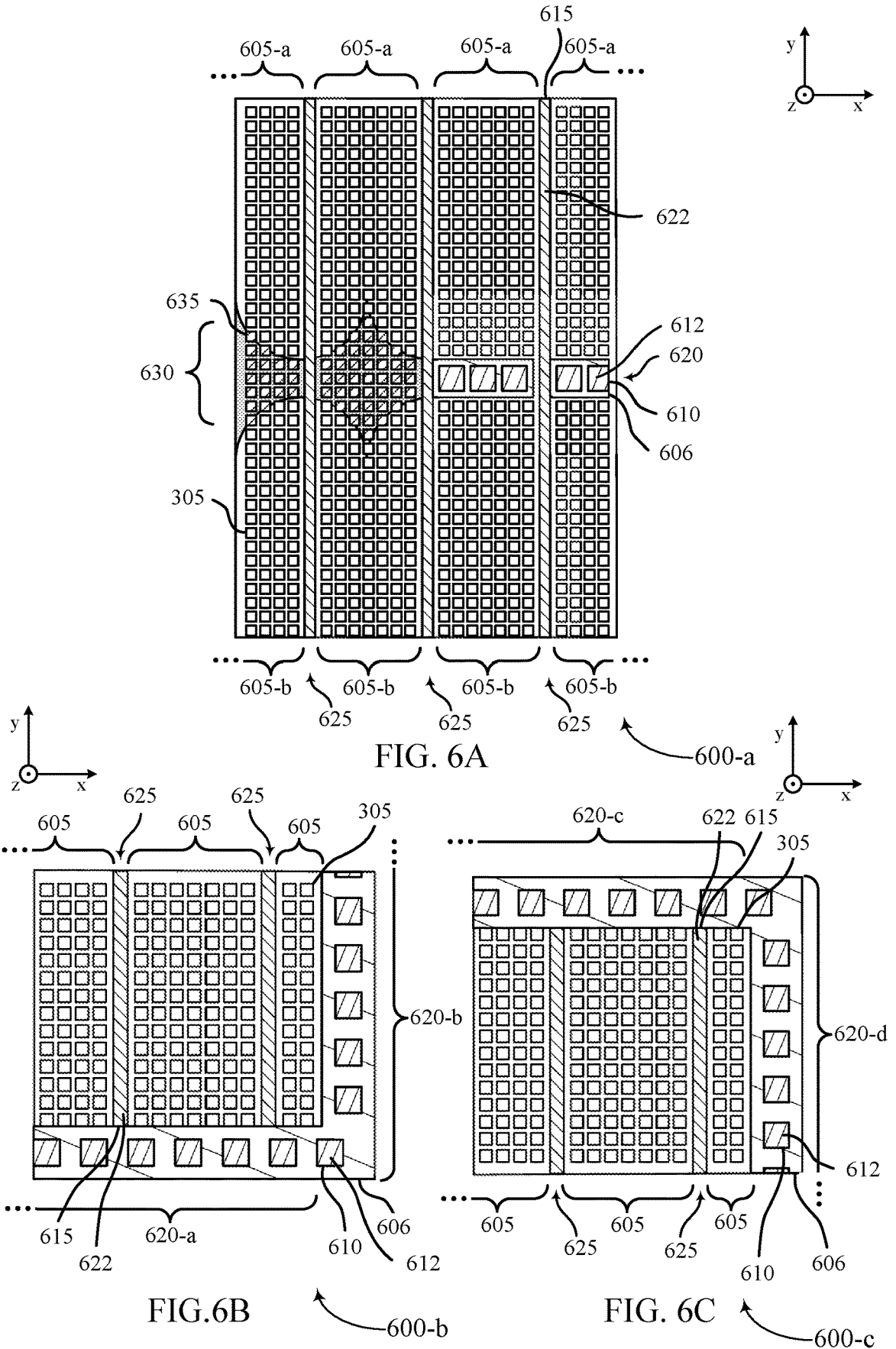
FIGS. 6A through 6C illustrate examples of material arrangements that support isolation regions within a memory die in accordance with examples as disclosed herein.

FIGS. 6A through 6C illustrate examples of material arrangements 600 that support isolation regions within a memory die in accordance with examples as disclosed herein. FIG. 6A may illustrate the material arrangement 600, and FIGS. 6B and 6C may illustrate portions (e.g., planes including one or more blocks 210) of the material arrangement 600. In some cases, the material arrangement 600 may be an example of an alternative configuration of the material arrangement 300 after the first set of operations. In such cases, the material arrangement 600 may be an example of a memory die (e.g., including one or more blocks of memory cells) at an intermediate step in fabrication, which may include a stack of material (e.g., a stack 340 as described with reference to FIG. 3). The material arrangement 600 may include isolation regions (e.g., isolation regions 303) formed in such a manner to provide structural support to the material arrangement 600 during fabrication. Accordingly, a quantity of support structures (e.g., structural pillars, dummy pillars) may be reduced or mitigated, and thus the material arrangement 600 may support a greater memory cell density.

In some examples, the material arrangement 600 may include regions 605, where the regions 605 may be examples of the region 301 and the region 302 as described with reference to FIG. 3. The regions 605 may each include one or more pillars 305. In some cases, a first plane of the material arrangement 600 may include regions 605-*a*, and a second plane of the material arrangement 600 may include the regions 605-*b*.

As illustrated in FIG. 6A, trenches 610 (e.g., first plurality of trenches) may be formed through the stack 340 extending along the x-direction (e.g., in a first direction). The trenches 610 may be formed in accordance with a material removal operation, where a mask material 606 (e.g., a first mask material, a hardmask), is deposited over the stack 340. The mask material 606 may not be deposited over locations corresponding to the trenches 610, and each of the trenches 610 may be formed based on removing portions of the stack 340 (e.g., the material 341, the material 342) at locations not covered by the mask material 606 (e.g., via etching operations, via photolithography). In some examples, the trenches 610 may be arranged in one or more rows (e.g., along the x-direction). Additionally or alternatively, the trenches 610 may have a same or similar dimension in both the x and y dimensions, and may be interposed between regions 605 with respect to the y-direction (e.g., the second direction, between regions 605-*a* and 605-*b*). Accordingly, the trenches 610 may be aligned with one or more respective boundaries of regions 605 extending in the x-direction.

In some examples, trenches 615 (e.g., second plurality of trenches) may be formed through the stack 340 extending along the y-direction. In some cases, the trenches 615 may be formed during a prior, same, or subsequent etching operation as the trenches 610. For example, the trenches 615 may be formed via a photolithography operation, where material 341 and 342 is removed from the stack 340 at locations not covered by a mask material (e.g., a second mask material; not shown). In such cases, the trenches 615 may have an x-dimension that is relatively smaller than the x-dimension, the y-dimension, or both dimensions of the trenches 610), and may be interposed between one or more of the regions 605 with respect to the x-direction (e.g., between blocks 210). Accordingly, the trenches 615 may be aligned with one or more respective boundaries of the regions 605 extending in the y-direction.

In some cases, a first plurality of voids (not shown) may be formed via the trenches 610 and in accordance with one or more etching operations. For example, the first plurality of voids may be formed by removing portions of the material 342 from the stack 340, where the material 342 is removed from each layer including the material 342 (e.g., from each second material layer). In some examples, the first plurality of voids may be relatively shallow (e.g., between 100 nm and 500 nm) with respect to the x- and y-directions such that corresponding material removal operations (e.g., etching operations) do not place undue stress on the material arrangement 600. Subsequently, a dielectric material 612

(e.g., an oxide, a third material) may be deposited within the trenches 610 and within first plurality of voids, forming a plurality of dielectric pillars at location corresponding to the trenches 615 and the isolation regions 620. The isolation regions 620 may provide structural support to the material arrangement 600. For example, the isolation regions 620 may relieve or otherwise mitigate stresses that would otherwise be caused by conventional manufacturing operations, thus preventing structural failures to the material arrangement 600.

In some cases, a second plurality of voids (not shown) may then be formed via the trenches 615 and in accordance with one or more etching operations. For example, the second plurality of voids may be formed by removing material 342 from each second material layer of the stack 340 through the regions 605, exposing surfaces of the pillars 305 and exposing portions of the surface of the dielectric material 612. In such examples, the second plurality of voids may be relatively deep with respect to the x-direction and y-direction (e.g., as compared to the first plurality of voids). The isolation regions 620 may provide structural support to the material arrangement 600 during the formation of the second plurality of voids. Additionally or alternatively, a dielectric material 622 (e.g., an oxide, a fourth material) may be deposited in the second plurality of voids and the trenches 615 (e.g., in contact with the pillars 305, in contact with portions of the dielectric material 612), forming continuous channels at locations of the trenches 616 and isolation regions 625. In conjunction with the isolation regions 620, the isolation regions 625 may electrically isolate the regions 605 from one another.

In some examples, the material arrangement 600 may include isolation regions 630. The isolation regions 630 may isolate one or more regions 605 from one another (e.g., with respect to the y-direction), and may include one or more pillars 635 (e.g., structural pillars). The pillars 635 may be formed prior to the isolation regions 620 and the isolation regions 630 and may include one or more materials (e.g., dielectric materials, sacrificial materials).

The pillars 635 may support the material arrangement 600 during fabrication. For example, as described herein, the formation of the trenches 610 and voids may mitigate stress applied to the material arrangement 600. That is, because the voids within the trenches may be relatively shallow (e.g., less material may be removed from the voids within the trenches 610 than from the voids within the trenches 615), the isolation region 620 may provide structural support without using dummy pillars. For example, the isolation region 620 may provide structure support during a process to remove nitride and replace it with a conductor to form the memory cells. Moreover, the isolation region 620 may be relatively narrow in the y-direction (e.g., as compared to the isolation regions 625), which may provide a space savings in each region 605. Additional memory cells may be formed in the additional space in each region 605, which may improve the overall memory cell density of the material arrangement 600.

Additionally or alternatively, because the isolation region 620 provides structural support, an area of the material arrangement 600 that is occupied by the isolation regions 630 may be reduced, and the quantity of pillars 635 may be reduced as well. In such cases, the isolation regions 620 my extend across the material arrangement 600 in the x-direction, and the material arrangement 600 may not include the isolation regions 630 or the pillars 635. Additionally or alternatively, the isolation regions 630 may have a greater dimension in the y-direction than the isolation regions 620 and, as such, may reduce a quantity of pillars 305 that the material arrangement 600 may include. By replacing at least a portion of the isolation regions 630 with the isolation regions 620, the material arrangement 600 may support a greater quantity of pillars 305 (e.g., one or more additional regions 605, additional rows and columns of pillars 305 in regions 605). For example, pillar 305 density may be improved (e.g., by 3 μm per region 605). Additionally or alternatively, access line contacts (e.g., contacts 310, bit line contacts) may be formed closer to regions 605, which may further improve spatial efficiencies.

In some examples, as illustrated in FIG. 6B, isolation regions 620 may be formed along one or more sides (e.g., boundaries, outer boundaries, edges) of the first plane of the material arrangement 600. FIG. 6B illustrates an alternative configuration of a first portion of the material arrangement 600 (e.g. a portion of the first plane). In some examples, an isolation region 620-a (e.g., a first portion of an isolation region 620) may be formed along a first side of the first plane extending in the x-direction, and an isolation region 620-b (e.g., a second portion of the isolation region 620) may be formed along a second side of the first plane extending in the y-direction.

In some examples, as illustrated in FIG. 6C, isolation regions 620 may be formed along one or more sides (e.g., boundaries, outer boundaries, edges) of a second plane of the material arrangement 600. FIG. 6C illustrates an alternative configuration of a second portion of the arrangement 600 (e.g., a portion of the second plane). In the second plane, an isolation region 620-c (e.g., a first portion of an isolation region 620) may be formed along a first side of the second plane extending in the x-direction, and an isolation region 620-d may be formed along a second side of the second plane extending in the y-direction. The isolation regions 620-a through 620-d may be formed in accordance with the operations described above (e.g., with reference to FIG. 6A), where a first portion of each trench 610 is formed along a first side of the first or the second plane and a second portion of each trench 610 is formed along a second side of the first or the second plane. The configurations of isolation regions 620 depicted in FIGS. 6B and 6C may provide additional support to the material arrangement 600. By forming isolation regions 620 along sides of the material arrangement 600, structural support may be further improved, and, as such, the likelihood of failure due to stresses during fabrication may be mitigated.

Figures 7A, 7B, 7C, 7D:
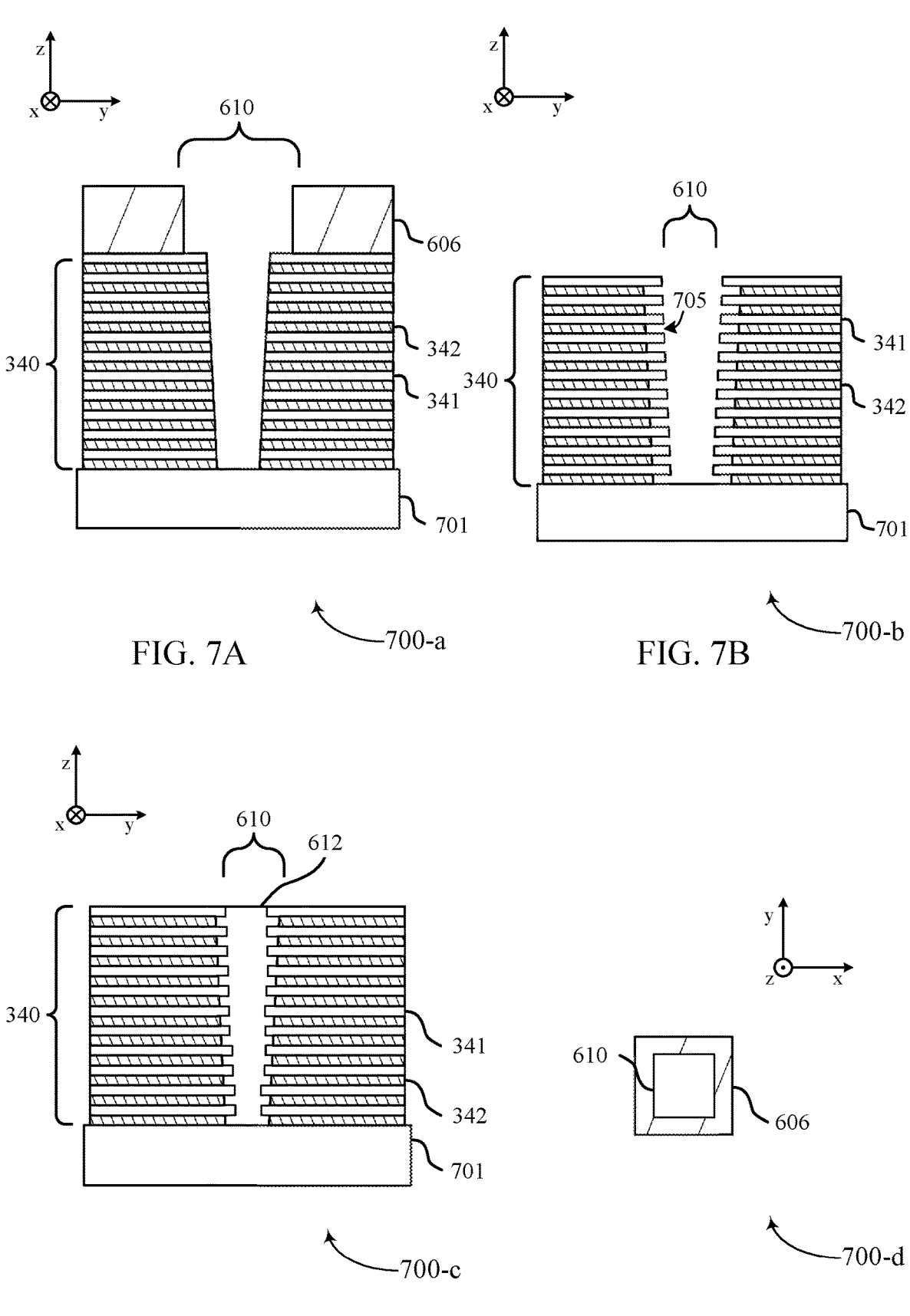
FIGS. 7A through 7D illustrate examples of processing steps that support isolation regions within a memory die in accordance with examples as disclosed herein.

FIGS. 7A through 7D illustrates examples of processing steps for forming a material arrangement 700 that support isolation regions within a memory die in accordance with examples as disclosed herein. The material arrangement 700 may be an example of the material arrangement 600, and FIGS. 7A through 7C may illustrate cross-sections of the material arrangement 700 at different stages of a manufacturing operation described with reference to FIGS. 6A through 6D. Accordingly, each cross-section may depict an isolation region 620 in the zy-plane at different stages of fabrication. FIG. 7D may illustrate a top view (e.g., in the xy-plane) of the material arrangement 700 during the set of processing steps described with reference to FIGS. 6A through 6D. The material arrangement 700 may include a material 701, where the material 701 may be an example of (e.g., is a composite representation of) at least the material 337, the material 336, the material 336, the stack 330, the material 325, and the substrate 315 (e.g., as described with reference to FIGS. 3 through 5).

FIG. 7A may illustrate the material arrangement 700 following one or more processing steps (e.g., deposition operations, etching operations) that support forming the trenches 610. For example, a mask material 606 may be deposited over the stack 340, where the mask material 606 may not cover locations of the material arrangement 700 corresponding to the trenches 610. In some examples, trenches 610 may be formed through the stack 340 by removing material (e.g., the material 341, the material 342) from each layer of the stack 340 at locations corresponding to the mask material 606. In such examples, the material 701 may act as an etch stop, in which, for example, a bottom surface of the trenches 610 may include the material 701.

FIG. 7B may illustrate the material arrangement 700 following one or more processing steps (e.g., material removal operations, etching operations) that support forming voids 705 (e.g., the first plurality of voids). In some cases, the mask material 606 may be removed from the material arrangement 700. In some examples, the voids 705 may be formed by removing the material 342 (e.g., the second material) from every other layer of the stack 340 (e.g., via a wet etching operation, via a dry etching operation). In such cases, the voids 705 may be relatively shallow with respect to the x- and y-directions, such that forming the voids 705 may not place undue stress on the material arrangement 700. In some examples, the voids 705 may be formed continuously between two or more trenches 610.

FIG. 7C may illustrate the material arrangement 700 following one or more processing steps (e.g., one or more deposition operations) for forming an isolation region 620. For example, the material 612 may be deposited in the voids 705 and the trenches 610, forming dielectric pillars and the isolation regions 620. Additionally or alternatively, the isolation regions 620 may extend between trenches 610. Forming the isolation regions 620 may include depositing the material 612 in the voids 705 such that layers of the material 612 may extend (e.g., extend continuously) between two or more of the dielectric pillars. Accordingly, the isolation regions 620 may separate one or more blocks of memory cells of the material arrangement 700 (e.g., with respect to the y-direction, with respect to the x-direction). In such examples, the isolation regions 620 (e.g., the dielectric pillars, the filled voids 705) may provide structural support to the material arrangement 700. For example, the isolation regions 620 may support forming the second plurality of voids (not shown) via the trenches 615 (not shown).

FIG. 7D may illustrate a portion of the material arrangement 700 following one or more processing steps (e.g., one or more etching operations) for forming trenches 610. For example, FIG. 7D may illustrate a top view of the trench 610 corresponding to the cross-section depicted in FIG. 7A (e.g., at the same processing step). The trench 610 may be formed at a location not covered by the mask material 606. The trench 610 may have a same or similar dimension in the x-direction, the y-direction, or in both directions.

Figures 8A, 8B, 8C:
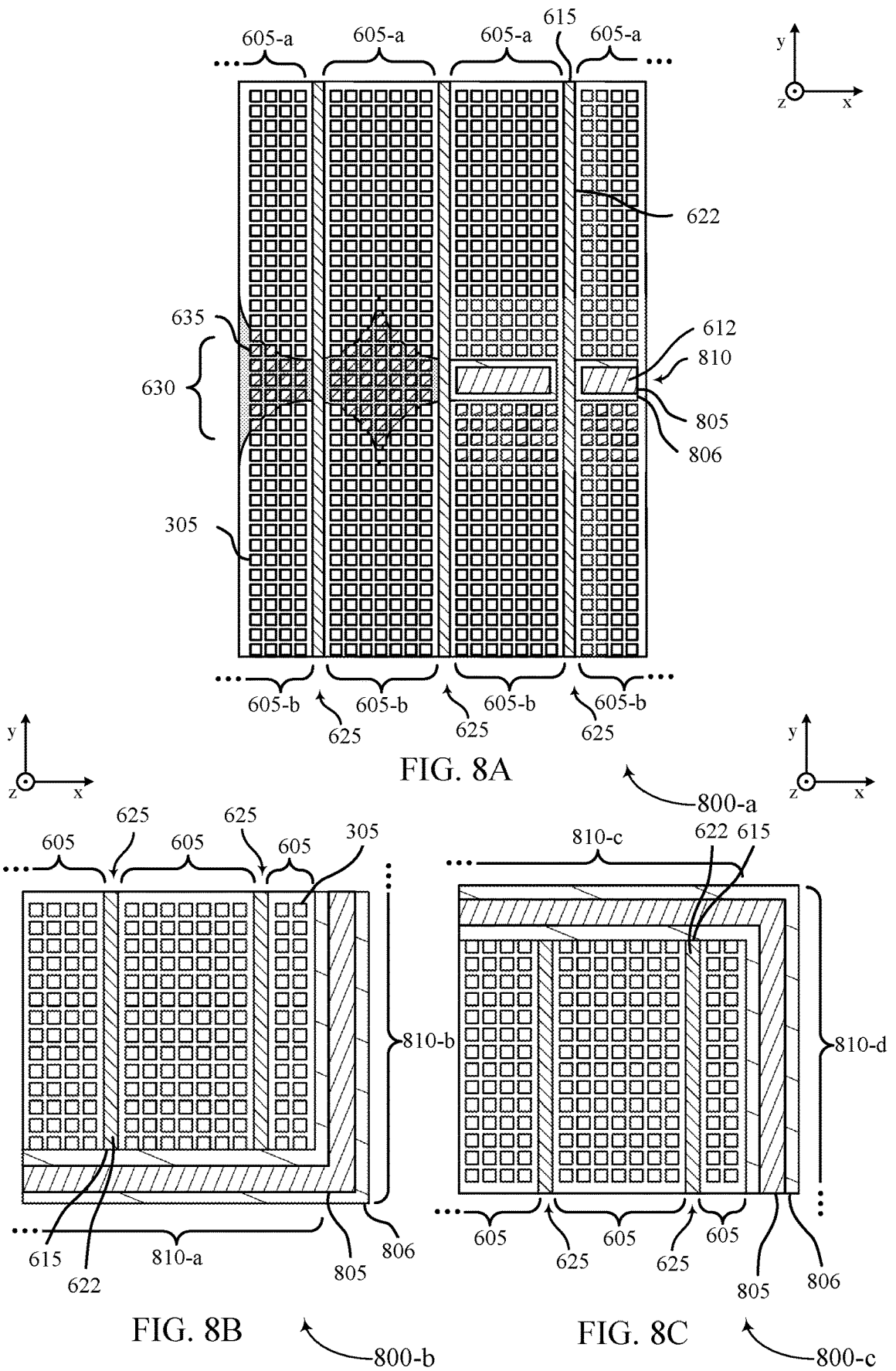
FIGS. 8A through 8C illustrate examples of material arrangements that support isolation regions within a memory die in accordance with examples as disclosed herein.

FIGS. 8A through 8C illustrate examples of material arrangements 800 that support isolation regions within a memory die in accordance with examples as disclosed herein. FIG. 8A may illustrate the material arrangement 800, and FIGS. 8B and 8C may illustration portions (e.g., planes including one or more blocks 210) of the material arrangement 800 following one or more alternative processing steps. In some cases, the material arrangement 800 may be an example of an alternative configuration of the material arrangement 600 (e.g., after one or more alternative processing steps). The material arrangement 800 may include regions 605 of pillars 305, formed in accordance with the first set of operations described with reference to FIG. 3. A first plane of the material arrangement 800 may include the regions 605-*a*, and a second plane of the material arrangement 800 may include the regions 605-*b*.

As illustrated in FIG. 8A, trenches 805 may be formed through the stack 340 extending along the x-direction. The trenches 805 may be formed in accordance with a photolithography operation, where a mask material 806 (e.g., a first mask material, a hardmask) is deposited over the stack 340. The mask material 806 may not cover locations corresponding to the trenches 805, and each of the trenches 805 may be formed based on removing portions of the stack 340 (e.g., the material 341, the material 342) at locations not covered by the mask material 806 (e.g., via etching operations, via photolithography). In some examples, the trenches 805 may each continuously extend along a respective boundary of the regions 605. The trenches 805 may be continuous between trenches 615, where an x-dimension of each trench 805 is relatively larger than its y-dimension. The first plurality of voids (not shown) may be formed in the trenches 805 as described with reference to FIG. 6. Additionally or alternatively, the dielectric material 612 may be deposited in the first plurality of voids and the trenches 805, forming continuous dielectric channels interposed between regions 605 (e.g., between the first plane and the second plane) of the material arrangement 800 and isolation regions 810. Isolation regions 810 may provide structural support to the material arrangement 800 during subsequent fabrication processes (e.g., forming the second plurality of voids). The isolation regions 625 may be formed as described with reference to FIG. 6.

In some examples, as illustrate in FIG. 8B, isolation regions 810 may be formed along one or more sides (e.g., boundaries, outer boundaries) of a first plane of the material arrangement 800. FIG. 8C illustrates an alternative configuration of a first portion of the material arrangement 800 (e.g., a portion of the first plane). In some cases, an isolation region 810-*a* (e.g., a first portion of isolation regions 810) may be formed along a first side extending in the x-direction, and an isolation region 810-*b* (e.g., a second portion of the isolation regions 810) may be formed along a second side extending in the y-direction.

In some examples, as illustrated in FIG. 8B, isolation regions 810 may be formed along one or more sides (e.g., boundaries, outer boundaries, edges) of the second plane of the material arrangement 800. FIG. 8C illustrates an alternative configuration of a second portion of the material arrangement 800 (e.g., a portion of the second plane). In some cases, an isolation region 810-*c* (e.g., a first portion of isolation regions 810) may be formed along a first side of the second plane extending in the x-direction, and an isolation region 810-*d* (e.g., a second portion of the isolation regions 810) may be formed along a second side of the second plane extending in the y-direction. The isolation regions 810-*a* through 810-*d* may each include a continuous dielectric channel as described with reference to FIG. 8A. In some instances, forming a material arrangement 800 as described with reference to FIG. 8 may use relatively fewer processing steps (e.g., relative to, for example, the material arrangement 600 as described with reference to FIG. 6), yet may still provide adequate structural support to mitigate the likelihood of failure due to stresses during fabrication.

Figures 9A, 9B, 9C:
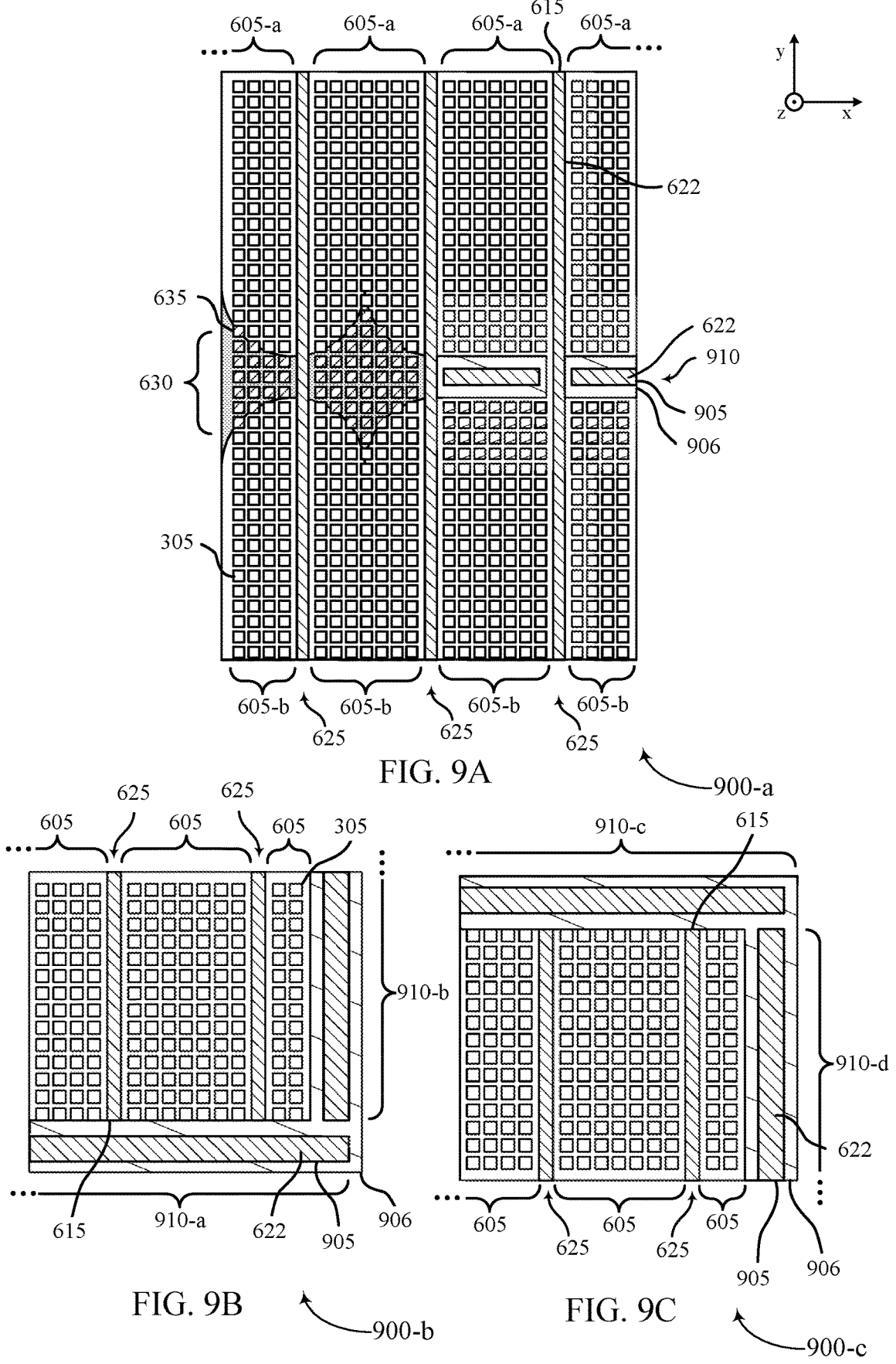
FIG. 9A through 9C illustrate examples of material arrangements that support isolation regions within a memory die in accordance with examples as disclosed herein.

FIGS. 9A through 9C illustrate examples of material arrangements 900 that support isolation regions within a memory die in accordance with examples as disclosed herein. FIG. 9A may illustrate the material arrangement 900, and FIGS. 9B and 9C may illustration portions (e.g., planes including one or more blocks 210) of the material arrangement 900 following one or more alternative processing steps. In some cases, the material arrangement 900 may be an example of an alternative configuration of the material arrangement 600 (e.g., after one or more alternative processing steps). The material arrangement 900 may include regions 605 of pillars 305, formed in accordance with the first set of operations described with reference to FIG. 3. A first plane of the material arrangement 900 may include the regions 605-*a*, and a second plane of the material arrangement 900 may include the regions 605-*b*.

As illustrated in FIG. 9A, trenches 905 may be formed through the stack 340 extending along the x-direction. The trenches 905 may be formed in accordance with a material removal operation, where portions of the stack 340 (e.g., the material 341, the material 342) are removed at locations not covered by a mask material 906. The layer of mask material 906 may have a relatively smaller y-dimension as compared to the layer of mask material 806. In some examples, the trenches 905 may each continuously extend along a respective boundary of the regions 605 (e.g., in an x-direction). The trenches 905 may be continuous between trenches 615, where an x-dimension of each trench 905 is relatively larger than its y-dimension. In such examples, the trenches 905 may have a relatively smaller y-dimension than the trenches 805 (e.g., in accordance with the layer of mask material 906).

The first plurality of voids (not shown) may be formed in the trenches 905 in a similar manner as described with reference to FIG. 6. For example, the first plurality of voids may be formed by removing a relatively greater quantity of material 342 from the stack 340 (e.g., than as described with reference to FIG. 6). Subsequently, a material 341 may be used to fill (e.g., backfill) at least a portion of the area from which the material 342 was removed. The dielectric material 622 may be then deposited in the first plurality of voids and the trenches 905, forming continuous dielectric channels interposed between regions 605 (e.g., between the first plane and the second plane) of the material arrangement 800 and isolation regions 910. Isolation regions 910 may provide structural support to the material arrangement 900 during later fabrication processes (e.g., forming the second plurality of voids). Additionally or alternatively, the isolation regions 625 and the isolation regions 910 may both include continuous dielectric channels of the material 622.

In some examples, as illustrate in FIG. 9B, isolation regions 910 may be formed along one or more sides (e.g., boundaries, outer boundaries) of a first plane of the material arrangement 900. FIG. 9C illustrates an alternative configuration of a first portion of the material arrangement 900 (e.g., a portion of the first plane). In some cases, an isolation region 910-*a* (e.g., a first portion of isolation regions 910) may be formed along a first side extending in the x-direction, and an isolation region 910-*b* (e.g., a second portion of the isolation regions 910) may be formed along a second side extending in the y-direction.

In some examples, as illustrated in FIG. 9C, isolation regions 910 may be formed along one or more sides (e.g., boundaries, outer boundaries) of the second plane of the material arrangement 900. FIG. 9C illustrates an alternative configuration of a second portion of the material arrangement 900 (e.g., a portion of the second plane). In some cases, an isolation region 910-*c* (e.g., a first portion of isolation regions 910) may be formed along a first side of the second plane extending in the x-direction, and an isolation region 910-*d* (e.g., a second portion of the isolation regions 910) may be formed along a second side of the second plane extending in the y-direction. The isolation regions 810-*a* through 810-*d* may each include a continuous dielectric channel including the material 622 as described with reference to FIG. 9A. In some instances, forming a material arrangement 900 as described with reference to FIG. 9 may use relatively fewer processing steps (e.g., relative to, for example, the material arrangement 600 as described with reference to FIG. 6), yet may still provide adequate structural support to mitigate the likelihood of failure due to stresses during fabrication.

FIG. 10 shows a flowchart illustrating a method 1000 that supports isolation regions within a memory die in accordance with examples as disclosed herein. The operations of the method 1000 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 1005, the method may include forming a stack of materials over a substrate of a memory die, the stack of materials including alternating layers of a first material and a second material, where the stack of materials includes a plurality of pillars arranged in a plurality of regions. The operations of 1005 may be performed in accordance with examples as disclosed herein.

At 1010, the method may include forming a first plurality of trenches through the stack of materials in a first direction, where the first plurality of trenches have a first dimension in a second direction. The operations of 1010 may be performed in accordance with examples as disclosed herein.

At 1015, the method may include forming a second plurality of trenches through the stack of materials in the second direction, where the second plurality of trenches have a second dimension in the first direction, the second dimension different than the first dimension. The operations of 1015 may be performed in accordance with examples as disclosed herein.

At 1020, the method may include removing a portion of the second material within each trench of the first plurality of trenches to form a first plurality of voids. The operations of 1020 may be performed in accordance with examples as disclosed herein.

At 1025, the method may include depositing a third material in the first plurality of trenches and the first plurality of voids, where a first region of the plurality of regions is isolated from a second region of the plurality of regions based at least in part on depositing the third material. The operations of 1025 may be performed in accordance with examples as disclosed herein.

In some examples, an apparatus (e.g., a manufacturing system) as described herein may perform a method or methods, such as the method 1000. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for forming a stack of materials over a substrate of a memory die, the stack of materials including alternating layers of a first material and a second material, where the stack of materials includes a plurality of pillars arranged in a plurality of regions; forming a first plurality of trenches through the stack of materials in a first direction, where the first plurality of trenches have a first dimension in a second direction; forming a second plurality of trenches through the stack of materials in the second direction, where the second plurality of trenches have a second dimension in the first direction, the second dimension different than the first dimension; removing a portion of the second material within each trench of the first plurality of trenches to form a first plurality of voids; and depositing a third material in the first plurality of trenches and the first plurality of voids, where a first region of the plurality of regions is isolated from a second region of the plurality of regions based at least in part on depositing the third material.

Aspect 2: The method or apparatus of aspect 1 where depositing the third material within each void of the first plurality of voids based at least in part on removing the portion of the second material from each second material layer of the stack of materials.

Aspect 3: The method or apparatus of aspect 2, further including operations, features, circuitry, logic, means, or instructions, or any combination thereof for depositing a first mask material over at least a portion of the stack of materials, where removing the portion of the second material from each second material layer of the stack of materials is based at least in part on depositing the first mask material.

Aspect 4: The method or apparatus of any of aspects 1 through 3, further including operations, features, circuitry, logic, means, or instructions, or any combination thereof for depositing a second mask material above the stack of materials, where forming the first plurality of trenches through the stack of materials is based at least in part on depositing the second mask material above the stack of materials.

Aspect 5: The method or apparatus of any of aspects 1 through 4, further including operations, features, circuitry, logic, means, or instructions, or any combination thereof for removing a portion of the second material within each trench of the second plurality of trenches to form a second plurality of voids, where forming the second plurality of voids exposes at least a portion of the third material and depositing a fourth material in the second plurality of trenches and the second plurality of voids, where at least a portion of the fourth material is in contact with at least a portion of the third material.

Aspect 6: The method or apparatus of aspect 5 where the third material and the fourth material include a same material.

Aspect 7: The method or apparatus of any of aspects 5 through 6 where the third material and the fourth material include different materials.

Aspect 8: The method or apparatus of any of aspects 5 through 7 where each void of the second plurality of voids include a greater dimension in the second direction than each void of the first plurality of voids.

Aspect 9: The method or apparatus of any of aspects 1 through 8 where forming the first plurality of trenches through the stack of materials includes operations, features, circuitry, logic, means, or instructions, or any combination thereof for forming, in the first direction, a first portion of each trench of the first plurality of trenches and forming, in the second direction, a second portion of each trench of the first plurality of trenches.

Aspect 10: The method or apparatus of aspect 9 where the first portion of each trench of the first plurality of trenches and the second portion of each trench of the first plurality of trenches are formed during a same etching process.

Aspect 11: The method or apparatus of any of aspects 1 through 10 where the first plurality of trenches are aligned with at least a respective first boundary of each region of the plurality of regions and the second plurality of trenches are aligned with at least a respective second boundary of each region of the plurality of regions, where the respective first boundaries are perpendicular to the respective second boundaries, and where each region of the plurality of regions includes a block of memory cells.

Aspect 12: The method or apparatus of any of aspects 1 through 11 where the first plurality of trenches include the first dimension in the first direction.

Aspect 13: The method or apparatus of any of aspects 1 through 12 where the third material extends continuously through the first plurality of trenches based at least in part on depositing the third material in the first plurality of trenches.

It should be noted that the described methods include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 14: An apparatus, including: a first plane including a first plurality of regions, where each region of the first plurality of regions includes a first plurality of pillars; a second plane including a second plurality of regions, where each region of the second plurality of regions includes a second plurality of pillars; a first isolation region extending in a first direction and bisecting the first plurality of regions of the first plane, where the first isolation region includes a first dimension in a second direction and isolates a first set of the first plurality of regions of the first plane from a second set of the first plurality of regions of the first plane; and a second isolation region extending in the second direction and located adjacent to a first side of a first region of the second plurality of regions of the second plane and adjacent to a second side of each region of the second plurality of regions of the second plane, where the second isolation region includes a second dimension in the first direction that is less than the first dimension.

Aspect 15: The apparatus of aspect 14, where the second isolation region includes: a first portion adjacent to the first side of the first region of the second plurality of regions of the second plane; and a second portion adjacent to the second side of each region of the second plurality of regions of the second plane, where the first portion is perpendicular to the second portion.

Aspect 16: The apparatus of any of aspects 14 through 15, where: the first isolation region includes a first dielectric material; and the second isolation region includes a second dielectric material.

Aspect 17: The apparatus of any of aspects 14 through 16, where the first dimension and the second dimension include a same dimension.

Aspect 18: The apparatus of any of aspects 14 through 17, where the first isolation region includes: a plurality of dielectric pillars, where each pillar of plurality of dielectric pillars includes the first dimension in both the first direction and the second direction.

Aspect 19: The apparatus of any of aspects 14 through 18, where the first isolation region includes a continuous channel of dielectric material.

An apparatus is described. The following provides an overview of aspects of the apparatus as described herein:

Aspect 20: An apparatus, including: a first plane including a first plurality of regions, where each region of the first plurality of regions includes a first plurality of pillars; a second plane including a second plurality of regions, where each region of the second plurality of regions includes a second plurality of pillars; a first isolation region extending in a first direction and bisecting the first plurality of regions of the first plane, where the first isolation region is formed by: forming a first plurality of trenches through a stack of materials in at least the first direction, where the first plurality of trenches include a first dimension in a second direction; removing a portion of a first material within each trench of the first plurality of trenches to form a first plurality of voids; and depositing a second material in the first plurality of trenches and the first plurality of voids; and a second isolation region extending in the second direction and located adjacent to a first side of a first region of the second plurality of regions of the second plane and adjacent to a second side of each region of the second plurality of regions of the second plane, where the second isolation region is formed by: forming a second plurality of trenches through the stack of materials in the second direction, where the second plurality of trenches include a second dimension in the first direction, the second dimension different than the first dimension.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials, or combinations thereof. In some examples, one layer or level may be composed of two or more sublayers or sublevels.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a first plane comprising a first plurality of regions, wherein each region of the first plurality of regions comprises a first plurality of pillars;
   a second plane comprising a second plurality of regions, wherein each region of the second plurality of regions comprises a second plurality of pillars;
   a first isolation region extending in a first direction and bisecting the first plurality of regions of the first plane, wherein the first isolation region comprises a first dimension in a second direction and isolates a first set of the first plurality of regions of the first plane from a second set of the first plurality of regions of the first plane; and
   a second isolation region extending along a first boundary of the second plane and along a second boundary of the second plane, wherein the second isolation region comprises a second dimension in the second direction that corresponds to a same portion of the first isolation region as the first dimension, wherein the second dimension is different than the first dimension, and wherein the second isolation region comprises a first portion extending in the first direction along the first boundary and a second portion extending in the second direction along the second boundary, and wherein the first portion is perpendicular to the second portion.

2. The apparatus of claim 1, wherein:
   the first portion is adjacent to a side of each region of the second plurality of regions of the second plane along the first direction; and
   the second portion is adjacent to a side of a first region of the second plurality of regions of the second plane along the second direction.

3. The apparatus of claim 1, wherein:
   the first isolation region comprises a first dielectric material; and
   the second isolation region comprises a second dielectric material.

4. The apparatus of claim 1, wherein the first isolation region comprises:
   a plurality of dielectric pillars, wherein each pillar of the plurality of dielectric pillars comprises the first dimension in both the first direction and the second direction.

5. The apparatus of claim 1, wherein the first isolation region comprises a continuous channel of dielectric material.

6. The apparatus of claim 1, further comprising:
   a third isolation region extending in the second direction and adjacent to a side of a first region of the first plurality of regions of the first plane along the second direction, wherein the third isolation region comprises a third dimension in the first direction that is less than the first dimension in the second direction.

7. The apparatus of claim 1, further comprising:
   a third isolation region extending in the second direction and adjacent to a side of a first region of the first plurality of regions of the first plane along the second direction, wherein the third isolation region comprises a third dimension in the first direction that is the same as the first dimension in the second direction.

* * * * *